(12) United States Patent
Tiemeijer et al.

(10) Patent No.: US 11,742,130 B2
(45) Date of Patent: Aug. 29, 2023

(54) HIGH CURRENT INTEGRATED CIRCUIT-BASED TRANSFORMER

(71) Applicant: NXP B.V., Eindhoven (NL)

(72) Inventors: Lukas Frederik Tiemeijer, Eindhoven (NL); Bartholomeus Wilhelmus Christiaan Hovens, Eindhoven (NL); Maarten Lont, Eindhoven (NL)

(73) Assignee: NXP B.V., Eindhoven (NL)

(*) Notice: Subject to any disclaimer, the term of this patent is extended or adjusted under 35 U.S.C. 154(b) by 496 days.

(21) Appl. No.: 16/449,673

(22) Filed: Jun. 24, 2019

(65) Prior Publication Data

US 2020/0402698 A1 Dec. 24, 2020

(51) Int. Cl.
| | |
|---|---|
| H01L 27/28 | (2006.01) |
| H01F 27/28 | (2006.01) |
| H01L 23/522 | (2006.01) |
| H01L 23/528 | (2006.01) |
| H01L 23/66 | (2006.01) |
| H01L 49/02 | (2006.01) |
| H03F 3/21 | (2006.01) |
| H03F 3/45 | (2006.01) |

(52) U.S. Cl.
CPC ..... *H01F 27/2804* (2013.01); *H01L 23/5226* (2013.01); *H01L 23/5283* (2013.01); *H01L 23/66* (2013.01); *H01L 28/10* (2013.01); *H03F 3/21* (2013.01); *H03F 3/45269* (2013.01); *H01F 2027/2809* (2013.01)

(58) Field of Classification Search
CPC ......... H01L 2924/0002; H01L 2924/00; H01L 23/5227; H01L 21/4814; H01L 2223/6627
See application file for complete search history.

(56) References Cited

U.S. PATENT DOCUMENTS

| | | |
|---|---|---|
| 9,159,484 B2 | 10/2015 | Tiemeijer |
| 9,775,610 B2 | 9/2017 | Gianesello et al. |
| 9,837,199 B2 | 12/2017 | Leuschner et al. |
| 2006/0077028 A1 | 4/2006 | Huang |

(Continued)

FOREIGN PATENT DOCUMENTS

| | | |
|---|---|---|
| EP | 2669906 A1 | 4/2013 |
| EP | 2669907 A1 | 4/2013 |

OTHER PUBLICATIONS

Hoa Thai Duong et al., Design of a High Gain Power Amplifier for 77 GHz Radar Automotive Applications in 65-nm CMOS, Proceedings of the 8th European Microwave Integrated Circuits Conference, Jan. 2013.

(Continued)

*Primary Examiner* — Tony Tran

(57) ABSTRACT

An integrated circuit transformer (150) is formed with a primary winding (91) located in at least a first winding layer having a first thickness, a secondary winding (92) located in at least the first winding layer and having a first center point at the first side of the transformer and two secondary terminals at a second, opposite side of the transformer, and a first center tap feed line (81) located along a symmetry axis of the transformer in an upper metal layer having a second thickness that is at least equivalent to the first thickness of the first winding layer, wherein the first center tap feed line has a direct electrical connection to the first center point in the secondary winding.

20 Claims, 13 Drawing Sheets

(56) References Cited

U.S. PATENT DOCUMENTS

| | | |
|---|---|---|
| 2008/0042792 A1 | 2/2008 | Chiu |
| 2009/0284339 A1 | 11/2009 | Choi et al. |
| 2010/0117737 A1* | 5/2010 | Kondo .................... H03F 1/565 |
| | | 330/276 |
| 2011/0210792 A1* | 9/2011 | Kawakami .......... H03F 3/45183 |
| | | 330/253 |
| 2012/0044034 A1 | 2/2012 | Nazarian et al. |
| 2013/0265132 A1 | 10/2013 | Huang et al. |
| 2013/0321116 A1 | 12/2013 | Tiemeijer |
| 2016/0027571 A1 | 1/2016 | Zhang et al. |
| 2017/0345559 A1 | 11/2017 | Vanukuru |
| 2019/0181234 A1 | 6/2019 | Tiemeijer et al. |

OTHER PUBLICATIONS

Vittorio Giammello et al., A Transformer-Coupling Current-Reuse SiGe HBT Power Amplifier for 77-GHz Automotive Radar, IEEE Transactions on Microwave Theory and Techniques, vol. 60, No. 6, Jun. 2012.

Luuk F. Tiemeijer et al., Analysis, Design, Modeling, and Characterization of Low-Loss Scalable On-Chip Transformers, IEEE Transactions on Microwave Theory and Techniques, vol. 61, No. 7, Jul. 2013.

* cited by examiner

HIGH CURRENT INTEGRATED CIRCUIT-BASED TRANSFORMER

BACKGROUND OF THE INVENTION

Field of the Invention

The present invention is directed in general to integrated circuit inductive devices. In one aspect, the present invention relates to integrated circuit transformer devices and methods for manufacturing and/or operating same.

Description of the Related Art

The development of integrated circuit technologies which provide thick top metal back-end layers has enabled the fabrication of high-quality inductive components (e.g., spiral inductors, transformers, and microstrip lines) which can operate at GHz frequencies that are suitable for high-performance, low-cost, high frequency-band applications, such as automotive radar sensors. In particular, 28 nm node CMOS process technologies which form multiple metal conductor layers, including copper layers of increasing thickness covered by one or more thick aluminum last metal layers, can be used to fabricate integrated circuit transformers which have two inductively coupled windings that provide the ability to transform impedance levels and provide galvanic isolation for high frequency signals that are attractive for inter-stage impedance matching in the differential power amplifier stages of new 78 GHz car-radar products. With existing approaches, an integrated circuit transformer can form two interleaved metal coils in one or more thickest upper layers which include an integer number of approximately circular turns. This can be advantageous since the top metal layers in an integrated circuit process technology have the largest thickness, and thus the lowest resistivity, and are therefore the most suitable layers for transformer windings which generally will carry the largest currents. However, the reduction of the maximum supply voltage in such scaled-down process technologies also requires increased drain currents to maintain the same RF output power level from the transformer circuit, thereby increasing the current loads on other parts of the transformer circuit which can reduce the lifetime of the circuit through electro-migration damage which accumulates over time. There are also integrated circuit transformer designs which use coils of the same type and diameter that are formed in different metal layers and connected in parallel, but these designs reduce coil series resistance at the expense of increasing inter-coil capacitance. In addition, there are existing inductor designs for interleaving coil windings to maximize the inductive coupling factor (K) and thus maximize the gain, and also adding a third coil where only the third coil has a center tap point configured to be coupled to a voltage source. However, the existing designs do not describe how to design and connect the coil center points. As seen from the foregoing, the design, manufacture, and use of existing integrated circuit transformers are extremely difficult at a practical level by virtue of the challenges with balancing the competing considerations of size, cost, high frequency performance, reliability, and protection against parasitic loop inductance from supply voltage conductors.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

A high current integrated circuit-based transformer device and associated methods of operation and fabrication are described for constructing a transformer having two inductively coupled windings wherein one or more coil or winding center points in an integrated circuit inductor are protected from high DC current loads by forming two coupled coils in the upper metal/conductor layers, and by also forming at least one coil center point feed line in an thicker upper metal/conductor layer to be contacted from two opposite sides along the symmetry axis of the transformer. By forming the coil center point feed lines on each side of the coil center point with metal/conductor layers of equal width and thickness, the DC current is equally divided between these two feed lines, thereby reducing DC current densities in each feed line. In selected embodiments, the integrated circuit-based transformer device is formed to include a primary transformer coil winding (with terminal end points and a transformer center point) located in one or more thicker upper metal conductor layers, a secondary transformer coil winding (with terminal end points and a transformer center point) located in one or more thicker upper metal conductor layers, and at least a first center tap conductor feed line that is formed in one of the thicker upper metal conductor layers (or in a plurality of thinner upper metal conductor layers) and connected to a first transformer coil center point. When referring to "primary" and "secondary" windings, the primary winding is the winding with the largest inductance value. And when referring to "gate" and "drain" windings, the drain winding is the winding that is connected to carry a high DC current under circuit operation. It should be noted that the drain winding can either be the primary winding or the secondary winding. By forming the first center tap conductor feed line(s) to have a combined thickness that is similar to those of the upper metal conductor layer used for the transformer coil windings and by positioning the center tap conductor feed line on both sides of the first transformer coil center point, the DC current through the first transformer coil center point is divided over the first center tap conductor feed line(s) such that the DC current density in each feed line is low enough that neither of feed lines becomes a bottleneck with respect to electromigration damage design rules. In addition, a second transformer coil center point is contacted using a second center tap conductor feed line running in a lower metal level. By making the center tap conductor feed lines to the two transformer coil center points in different metal layers, they can both be routed along the symmetry axis of the transformer without imposing any restriction on the sides from where the coils center points can be reached.

Figure 1:
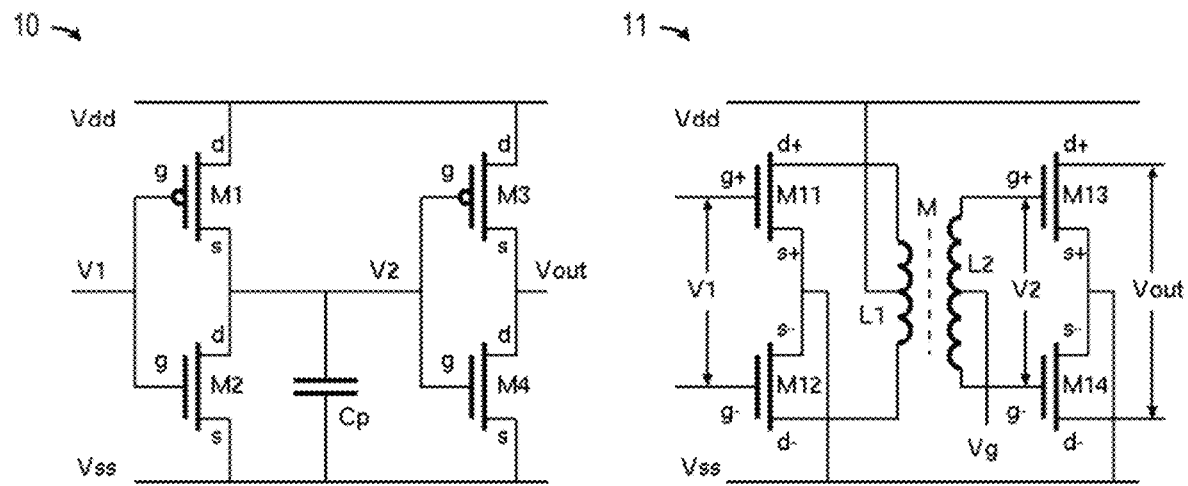
FIG. 1 depicts a circuit diagram of a basic CMOS inverter and a transformer coupled RF-CMOS differential amplifier.

To provide additional details for an improved contextual understanding of the present disclosure, reference is now made to FIG. 1 which depicts a circuit diagram of a basic CMOS inverter 10 and a transformer coupled RF-CMOS differential amplifier 11. In the CMOS inverter 10, a first pair of PMOS and NMOS transistors M1, M2 is connected in series between Vdd and Vss to receive an input voltage V1, and the shared node V2 has a parasitic capacitance Cp that is provided as an input to the second pair of PMOS and NMOS transistors M3, M4 which are connected in series between Vdd and Vss to generate the inverter output Vout. In the digital CMOS circuit 10, the current consumption comes from the charging and discharging of the MOS transistor gate, drain junction, and interconnect capacitances. Therefore, the resulting power consumption is proportional to the circuit operation frequency. And while the trend towards smaller feature sizes, smaller parasitic capacitances, and lower operation voltages helps decrease this power consumption, there are inevitable parasitic capacitances which can limit practical clock frequency values to around 3 GHz for present day digital circuitry. In the digital CMOS inverter 10, current is lost in loading and unloading the circuit's parasitic capacitance Cp. To make efficient electronic circuits operating at a significantly higher frequency, one needs to recycle the energy going into the parasitic capacitances through inductive circuit elements.

To this end, integrated circuit-based transformers can be used to recycle energy in a very area-efficient way. In particular, the RF-CMOS differential amplifier 11 is depicted which includes a first pair of NMOS transistors M11, M12 with their drain nodes connected to a first inductor L1 to receive an input voltage V1 across the gates of transistors M11, M12, where the first inductor L1 has a center point connected to Vdd and where the shared source nodes of the transistors M11, M12 are connected to Vss. In addition, a second pair of NMOS transistors M13, M14 is provided with their gate nodes connected across a second inductor L2 to generate voltage V2, where the second inductor L2 has a center point connected to Vg and where shared source node of the transistors M13, M14 is again connected to Vss. Instead of losing current during the loading and unloading of circuit capacitance Cp, the transformer coupled RF-CMOS differential amplifier 11 is able to recycle the current with the inductive elements L1, L2. While full (100%) energy reuse is only possible at a single operation frequency, a suitable design would typically aim for about 90% energy reuse to ensure the circuit can be used over a sufficiently large frequency range. As will be appreciated, persons skilled in the art of radio frequency circuit design will understand how to precisely tune the coupled coil diameter or inductance values to optimize the performance in a given application at a given frequency using electromagnetic and circuit simulation techniques.

Figure 2:
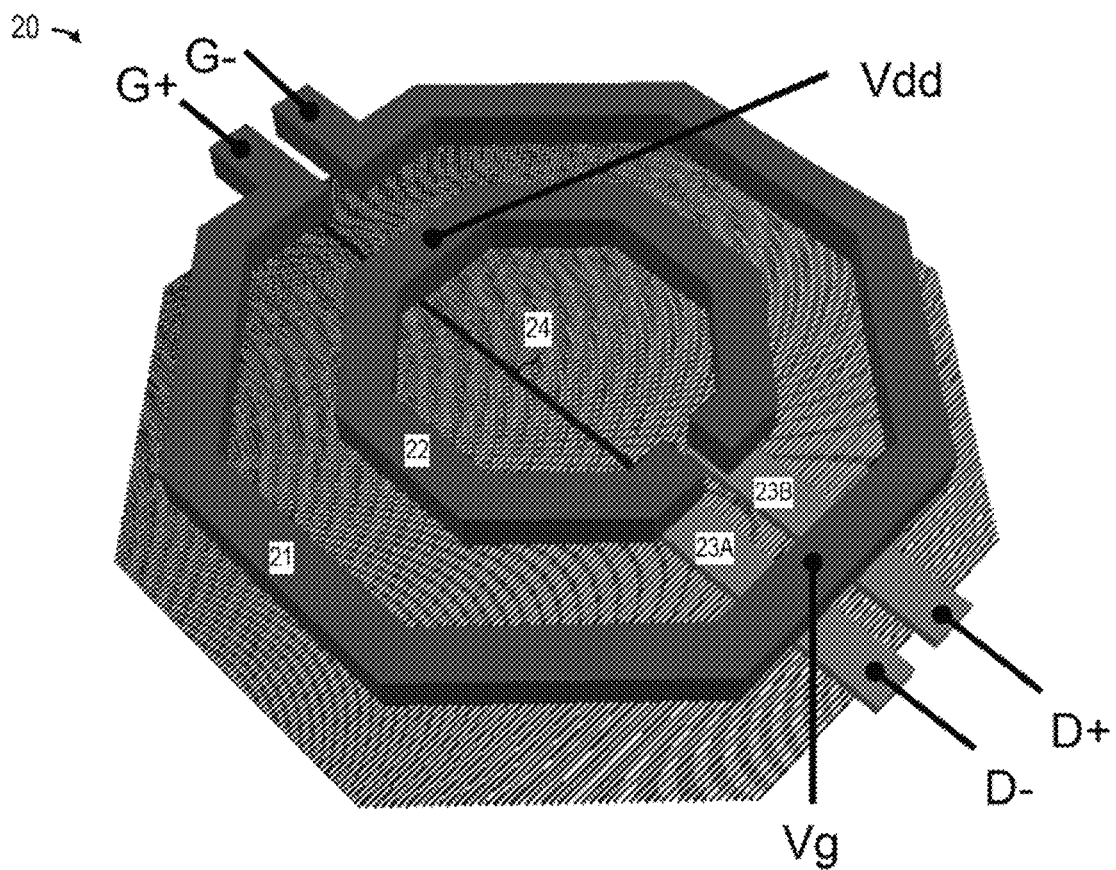
FIG. 2 depicts a perspective view of an integrated circuit transformer.

To provide additional details for an improved contextual understanding of the present disclosure, reference is now made to FIG. 2 which depicts a perspective view of an integrated circuit transformer 20. As depicted, the IC transformer 20 includes an outer primary winding 21 located in a winding layer and having two primary gate terminals G+, G− at a first side of the transformer. In addition, the IC transformer 20 includes an inner secondary winding 22 located in a winding layer and having two secondary terminals at a second, opposite side of the transformer for connection through underlying conductor lines 23A, 23B to secondary drain terminals D+, D−. Though not shown, the center point of the inner secondary winding 22 may be connected to the supply voltage Vdd through a center tap connection 24 formed in an underlying conductor layer. Since center tap connections do not carry RF currents, they are not conventionally understood to affect RF performance, and therefore have not been designed in existing solutions to withstand the high DC drive currents which occur in high power (50 mW) high frequency (78 GHz) amplifier stages where these transformers are attractive for impedance matching and energy efficiency.

Figure 3:
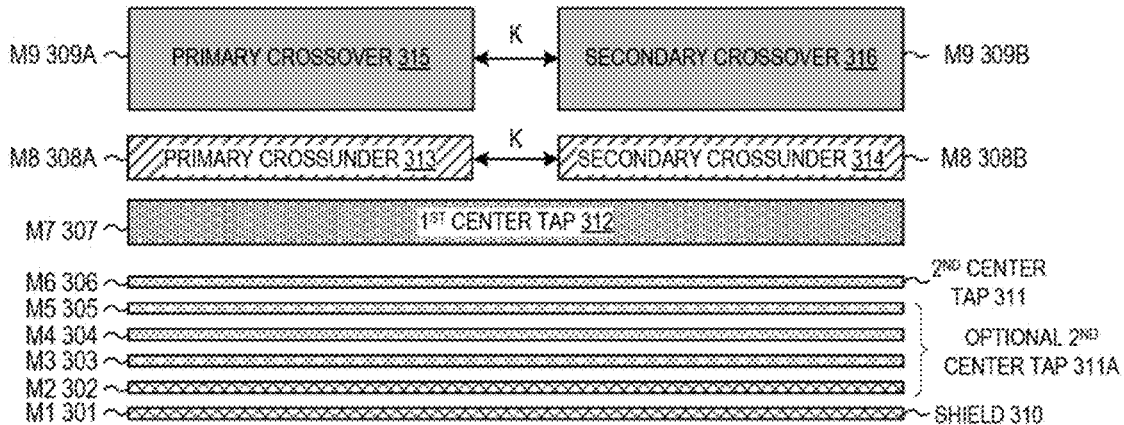
FIG. 3 depicts a simplified cross-sectional side view of the conductive metal layers that may be used to fabricate an integrated circuit transformer in accordance with a first selected embodiment of the present disclosure.
Figure 4:
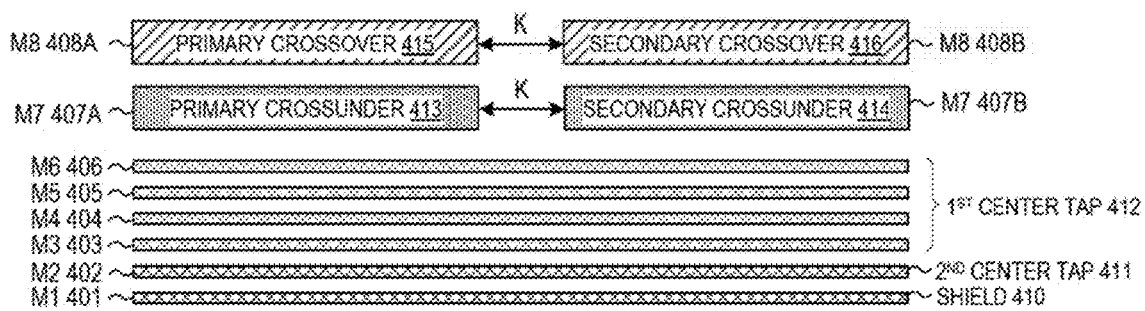
FIG. 4 depicts a simplified cross-sectional side view of the conductive metal layers that may be used to fabricate an integrated circuit transformer in accordance with a second selected embodiment of the present disclosure.
Figure 5:
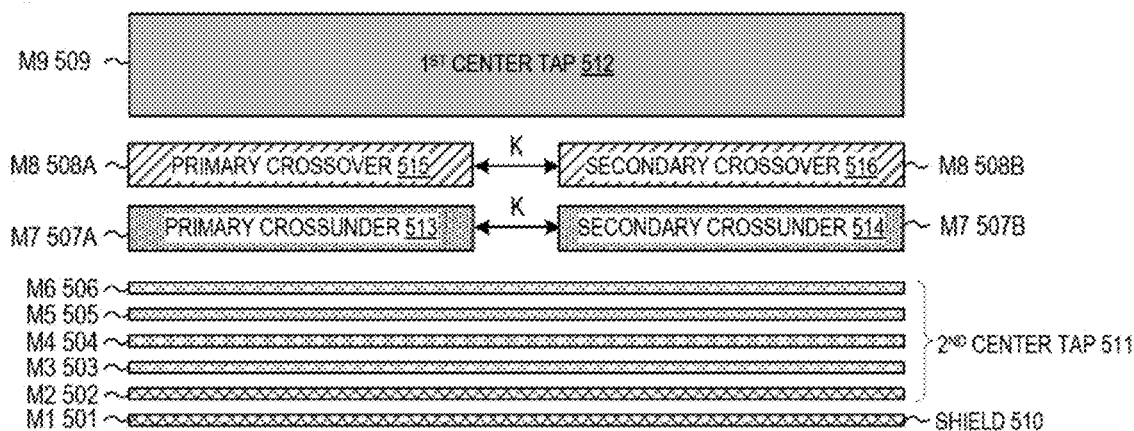
FIG. 5 depicts a simplified cross-sectional side view of the conductive metal layers that may be used to fabricate an integrated circuit transformer in accordance with a third selected embodiment of the present disclosure.

To address these design challenges and other limitations from conventional integrated circuit transformer solutions, reference is now made to FIGS. 3-5 which illustrate simplified cross-sectional side views of the conductive metal layers (e.g., M1-M9) that may be used to fabricate an integrated circuit transformer in accordance with selected embodiments of the present disclosure. In each of the depicted example embodiments, the transformer is constructed with the back-end conductive or metal layers of a semiconductor fabrication process which may form a first plurality of thin copper layers over a substrate, such as by sequentially depositing six (6) thin copper layers M1-M6 of a first predetermined thickness (e.g., 85 nm) that are intended for short range circuit connections in the integrated circuit. In addition, a second plurality of relatively thicker copper layers may be formed over the first plurality of thin copper layers and separated from one another with inter-layer dielectric (ILD) layers, such as by depositing two (2) thicker copper layers M7-M8 of a second predetermined thickness (e.g., 850 nm) that are intended for long range circuit connections and local power supply lines in the integrated circuit. Finally, a last or top conductive layer may be formed over the second plurality of thick copper layers, such as by depositing a thicker aluminum layer M9 of a third predetermined thickness (e.g., 2800 nm) that is intended for global power supply lines and the bond pads. Though not shown, the conductive metal layers M1-M9 are separated from one another with inter-layer dielectric (ILD) layers, and are connected where needed by conductive via structures which penetrate the ILD layers to electrically connect adjoining conductive metal layers. In addition, the shape and dimensions of each conductive metal layers M1-M9 may be patterned to adjust the parameters of each integrated circuit so that a transformer with separately tunable inductance values for a primary and secondary coil can be formed in the top thick metal layers with patterned conductive metal layers that are concentrically shaped, but with different radii. As will be appreciated, the size and spacing of the individual conductive metal layers may be exaggerated and not drawn on scale for illustrative purposes.

Turning now to FIG. 3, there is illustrated a simplified cross-sectional side view 30 of the conductive metal layers M1-M9 that may be used to fabricate an integrated circuit transformer in accordance with a first selected embodiment of the present disclosure. By way of example, the conductive metal layers M1-M9 may be formed over a substrate and gate conductors (not shown) as levels 301-309 at which routing layers are formed. In an example embodiment, six metal routing layers M1-M6 formed at levels 301-306 can be referred to as local metal routing layers, and have thicknesses that are thin enough to allow even dense areas of small standard FET devices to be interconnected. Over the thin metal routing layers M1-M6, relatively thicker metal routing layers M7-M8 formed at levels 307-308 can be referred to as global metal routing layers. Finally, a relatively thick metal routing layer M9 formed at level 309 is formed as the top or last metal routing layer(s). The thin metal routing layers 301-306 have a thickness that is less than the thickness of the global metal routing layers 307-308, and the top or last metal routing layer is the thickest metal routing layer. According to an example embodiment, a ratio of the thickness of the thin metal layer, relatively thicker metal layer and thick metal routing layer is 1:2:8 to 1:10:32. In FIG. 3, the primary coil is realized in the top aluminum layer M9 309A with a primary crossover layer 315 and in the last (or cross-under) copper layer M8 308A with a primary crossunder layer 313 which may be patterned into a first coil shape and connected by conductive via structures between the conductive metal layers M8 and M9. In similar fashion, a secondary coil is realized in the top (or crossover) aluminum layer M9 309B with a secondary crossover layer 316 and in the last (or cross-under) copper layer M8 308B with a secondary crossunder layer 314 which may be patterned into a second coil shape and connected by conductive via structures between the conductive metal layers M8 and M9. The smaller the lateral spacing between the primary and secondary coils, the stronger their inductive coupling K. For a 1×1 turn transformer, an aluminum secondary coil will crossover a copper primary coil near the primary coil's center point. Except at this crossing area, the primary and secondary coils exist in both the conductive metal layers M8 308 and M9 309. For multi-turn transformers, more crossings are needed which again can be realized in the top two metal layers. Since both the crossings and the connections to the coil center points must be made on the transformer symmetry axis, separate metal layers are needed for them.

Figure 11:
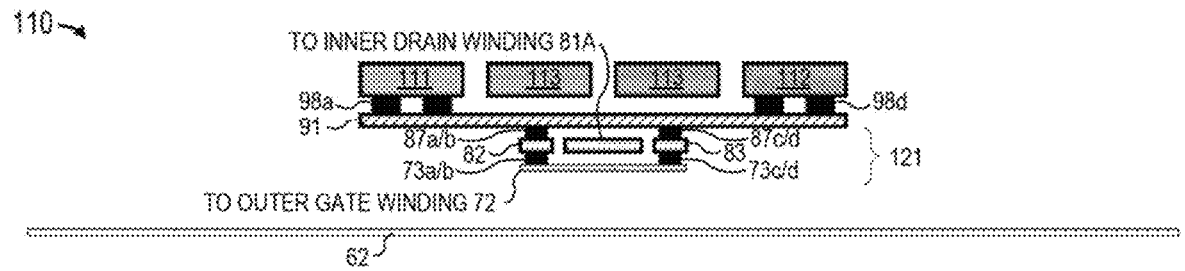
FIG. 11 depicts a simplified cross-sectional side view through a center point of the outer gate coil in the integrated circuit transformer in accordance with selected embodiments of the present disclosure.
Figure 12:
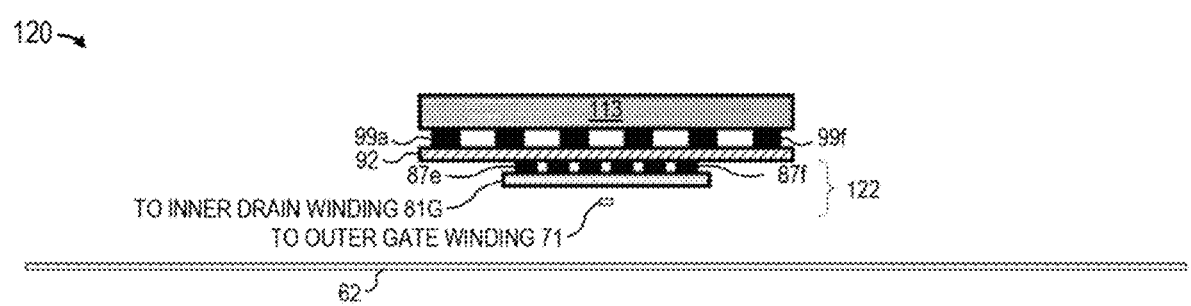
FIG. 12 depicts a simplified cross-sectional side view through a center point of the inner drain coil in the integrated circuit transformer in accordance with selected embodiments of the present disclosure.

In the cross-sectional side view 30 shown in FIG. 3, the first thin metal routing layer M1 301 may be used to form a ground shield layer 310 for protecting the integrated circuit transformer from substrate noise. In one or more of the remaining thin metal routing layers M2-M6 302-306, a second wire is formed that connects to the second center tap 311. In applications where the DC current density requirements for the second center tap are not significant, a single thin metal routing layer (e.g., M6 306) may suffice, but additional thin metal routing layers (e.g., M2-M5) can be added form the second center tap 311A. Since the wire connecting to the first center tap 312 needs to carry the same DC current as the relatively thicker metal routing layer M8 for the coil itself, the first center tap feed line 312 is formed in the relatively thicker metal routing layer M7 which has a similar thickness and current carrying capability as the relatively thicker metal routing layer M8 for the coil layers. The layout and manufacture of the integrated circuit transformer will be better understood with reference to FIGS. 6-12, wherein FIGS. 6-10 show plan views of alternate metal conductor layers of the integrated circuit transformer, and FIGS. 11-12 show cross-sectional side views of levels of metal conductor layers of the integrated circuit transformer.

Turning now to FIG. 4, there is illustrated a simplified cross-sectional side view 40 of the conductive metal layers M1-M8 that may be used to fabricate an integrated circuit transformer in accordance with a second selected embodiment of the present disclosure. In the example embodiment, there is no top aluminum conductive layer, and the integrated circuit transformer is formed in a first plurality (e.g., 6) of local metal routing layers M1-M6 formed at levels 401-406 at a first predetermined thicknesses and a second plurality (e.g., 2) of relatively thicker global metal routing layers M7-M8 formed at levels 407-408. Though not drawn to scale, the thin metal routing layers 401-406 have a thickness that is less than the thickness of the global metal routing layers 407-408 such that a ratio of the thickness of the thin metal routing layer (e.g., 401) to the relatively thicker global metal routing layer (e.g., 407) is 1:2 to 1:10. In FIG. 4, the primary coil is realized in the top (or crossover) copper layer M8 408A with a primary crossover layer 415 and in the underlying (or cross-under) copper layer M8 407A with a primary crossunder layer 413 which may be patterned into a first coil shape and connected by conductive via structures between the conductive metal layers M7 and M8. In addition, a secondary coil is realized in the top (or crossover) copper layer M8 408B with a secondary crossover layer 416 and in the underlying (or cross-under) copper layer M7 407B with a secondary crossunder layer 414 which may be patterned into a second coil shape and connected by conductive via structures between the conductive metal layers M7 and M8. The inductive coupling effects K of the lateral spacing between the primary and secondary coils and the use of underlying metal layers to provide crossover connections at center points of the coil(s) is similar to the example described in FIG. 3. Since the wire connecting to the first center tap 412 needs to carry the same DC current as the relatively thicker metal routing layer M7 for the coil itself, the first center tap feed line 412 is formed with a combination of thin metal routing layers M3-M6 403-406 which are connected together by conductive via structures (not shown) to provide an effective thickness that has a current carrying capability that is comparable to the relatively thicker metal routing layer M7 for the coil layers. In one or more of the remaining thin metal routing layers (e.g., M2 402), a second wire is formed that connects to the second center tap 411. In addition, the first thin metal routing layer M1 401 may be used to form a ground shield layer 410 for protecting the integrated circuit transformer from substrate noise.

Turning now to FIG. 5, there is illustrated a simplified cross-sectional side view 50 of the conductive metal layers M1-M9 that may be used to fabricate an integrated circuit transformer in accordance with a third selected embodiment of the present disclosure. In the example embodiment, the integrated circuit transformer is formed in a plurality of conductive metal layers M1-M9 501-509, including a first plurality (e.g., 6) of local metal routing layers M1-M6 formed at levels 501-506 at a first predetermined thicknesses, a second plurality (e.g., 2) of relatively thicker global metal routing layers M7-M8 formed at levels 507-508, and one or more relatively thick topmost metal routing layers M9 formed at level 509. Again, the conductive metal layers M1-M9 501-509 have different thicknesses which are not drawn to scale. In FIG. 5, the primary coil is realized in the top (or crossover) copper layer M8 508A with a primary crossover layer 515 and in the underlying (or cross-under) copper layer M7 507A with a primary crossunder layer 513 which may be patterned into a first coil shape and connected by conductive via structures between the conductive metal layers M7 and M8. In addition, a secondary coil is realized in the top (or crossover) copper layer M8 508B with a secondary crossover layer 516 and in the underlying (or cross-under) copper layer M7 507B with a secondary crossunder layer 514 which may be patterned into a second coil shape and connected by conductive via structures between the conductive metal layers M7 and M8. Again, the inductive coupling effects K of the lateral spacing between the primary and secondary coils and the use of underlying metal layers to provide crossover connections at center points of the coil(s) is similar to the example described in FIG. 3. Since the wire connecting to the first center tap 512 needs to carry the same DC current as the relatively thicker metal routing layers M7, M8 for the coils, the first center tap feed line 512 is formed in the relatively thick aluminum layer 509 that has a current carrying capability that is comparable to the relatively thicker metal routing layers M7, M8 for the coil layers. In one or more of the thin metal routing layers M2-M6 502-506, a second wire is formed that connects to the second center tap 511. In applications where the DC current density requirements for the second center tap are not significant, a single thin metal routing layer (e.g., M6 506) may suffice, but additional thin metal routing layers (e.g., M2-M5) can be added form the second center tap 511. In addition, the first thin metal routing layer M1 501 may be used to form a ground shield layer 510 for protecting the integrated circuit transformer from substrate noise.

As will be appreciated, the pattern and etch processing techniques used to form the coil features prevent the coil width and spacing from being much smaller than the thickness of the coil metal layers. Thus, if a coil is to be fabricated having a width below 4 μm and a spacing below 2 μm, the aluminum layer M9 should not be used to form the coils (as shown in FIG. 3), and the transformer coils should instead be realized in the two thick copper layers M7, M8 (such as shown in FIGS. 4-5). In this case, the first center tap connection should be formed in the thick aluminum metal layer M9 (such as shown in FIG. 5) or in the thin copper metal layers (as shown in FIG. 4) where the layers (e.g., M3-M6) may be connected together in parallel to effectively form a larger wire width that compensates for the lack of thickness of the individual thin layers. Similarly, the second center-tap may be formed by connecting two or more thin copper metal layers in parallel.

Figure 8:
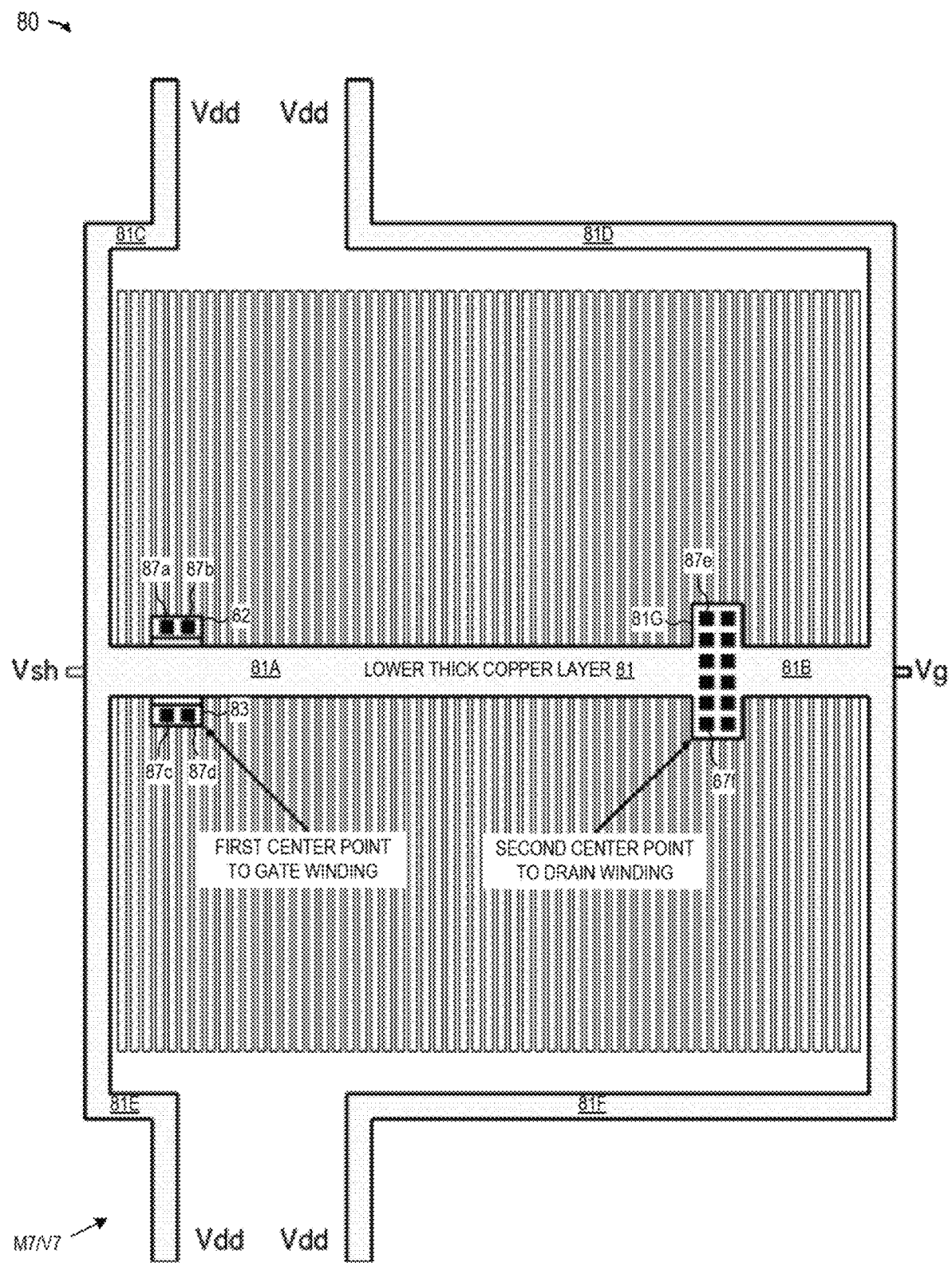
FIG. 8 depicts a plan view of a patterned third metal layer in the integrated circuit transformer at a level above that of FIG. 7.
Figure 9:
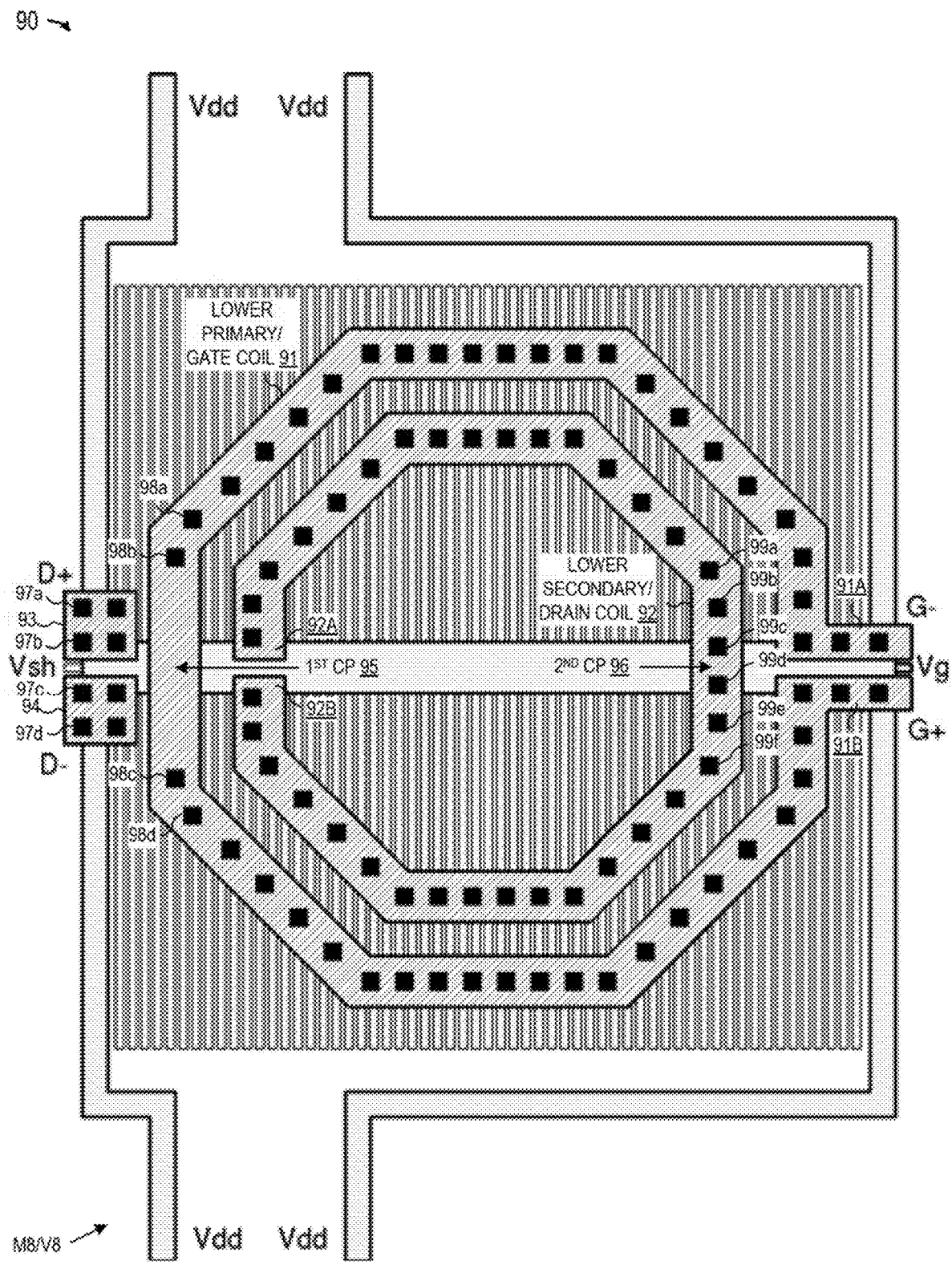
FIG. 9 depicts a plan view of a patterned fourth metal layer in the integrated circuit transformer at a level above that of FIG. 8.
Figure 10:
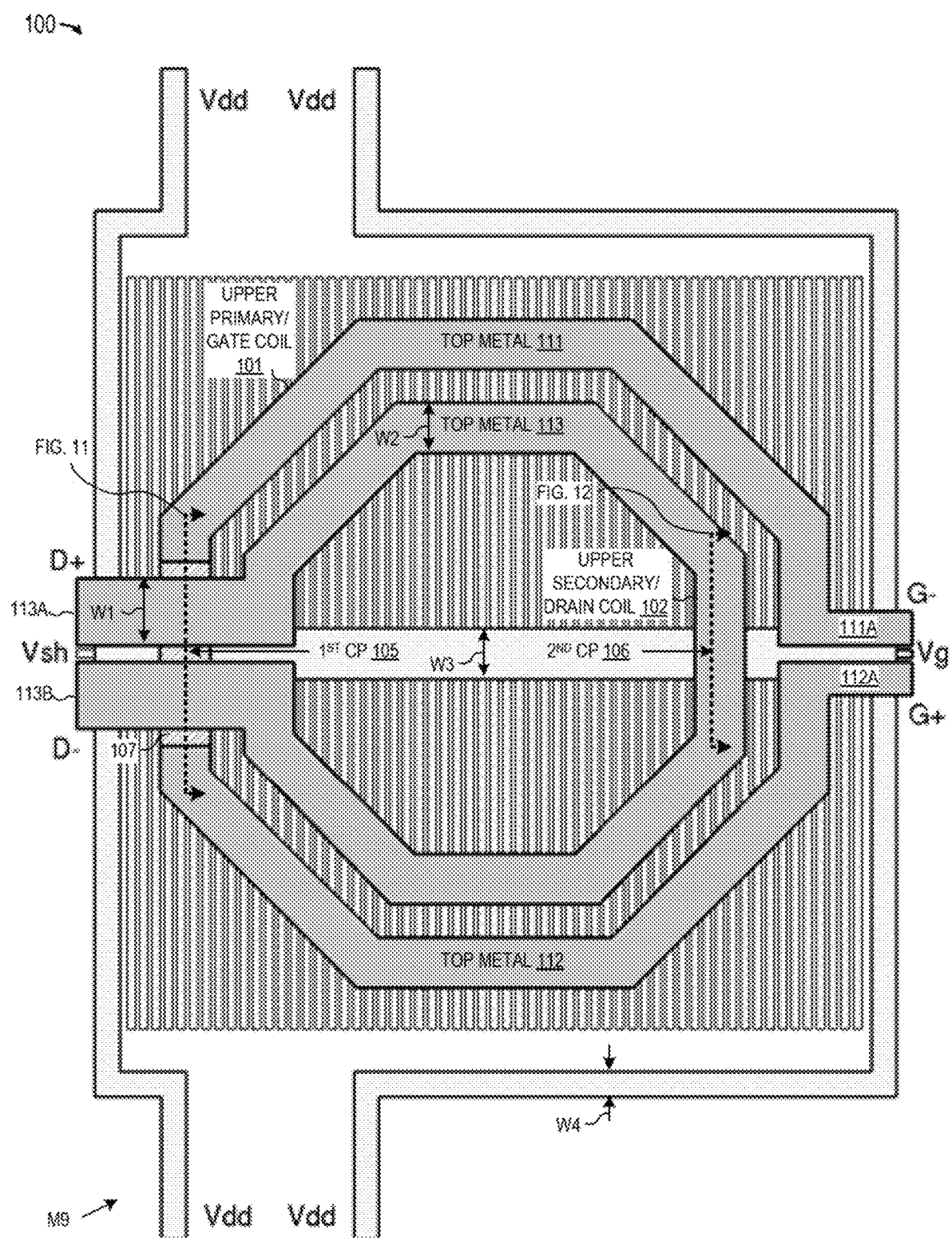
FIG. 10 depicts a plan view of a patterned fifth metal layer in the integrated circuit transformer at a level above that of FIG. 9.

To provide additional details for an improved understanding of selected embodiments of the present disclosure, reference is now made to FIGS. 6-10 which illustrate example features in the different metal layers, starting from the lowest metal layer M1 (FIG. 6) and continuing to the top metal layer M9 (FIG. 10). As will be appreciated, each metal layer feature in a given layer may be fabricated using any suitable backend process, such as depositing a conductive metal layer on a planarized dielectric layer, planarizing the deposited conductive metal layer, and then patterning and etching the conductive metal layer to define the desired features in each metal layer. As a result, the integrated circuit transformer can be formed with metal layers M1-M9 formed by sequentially depositing, planarizing, patterning and etching any suitable conductive material (e.g., aluminum, copper, tantalum, tungsten, tantalum nitride, tungsten nitride, titanium, titanium nitride, or the like and combinations of the above) over an underlying ILD layer which separates each metal layer from the underlying metal layer(s) so as to be electrically disconnected from one another. As will be appreciated, each constituent conductor layer in the interconnect stack may be formed using chemical vapor deposition (CVD), plasma-enhanced chemical vapor deposition (PECVD), physical vapor deposition (PVD), atomic layer deposition (ALD), focused ion beam (FIB) deposition, Electron Beam Induced Deposition (EBID), micro-chemical vapor deposition, laser-focused deposition, laser-focused atomic deposition, or any other suitable deposition or localized deposition techniques or any combination(s) of the above to a predetermined final thickness. Where appropriate, the plan views include indications where connections between the different metal levels are made with one or more conductive via structures. While the specific arrangement, construction, and connection of the different conductive interconnect layers is not important, each may be constructed within a constituent ILD layer using a damascene process in which conductive layers are deposited in openings formed in the constituent ILD layer and then polished or etched back to be planar with the constituent ILD layer as known to those skilled in the art. Of course, other more traditional interconnect fabrication techniques may be used to construct the different conductive interconnect layers, such as photoresist masking and plasma etching.

Figure 6:
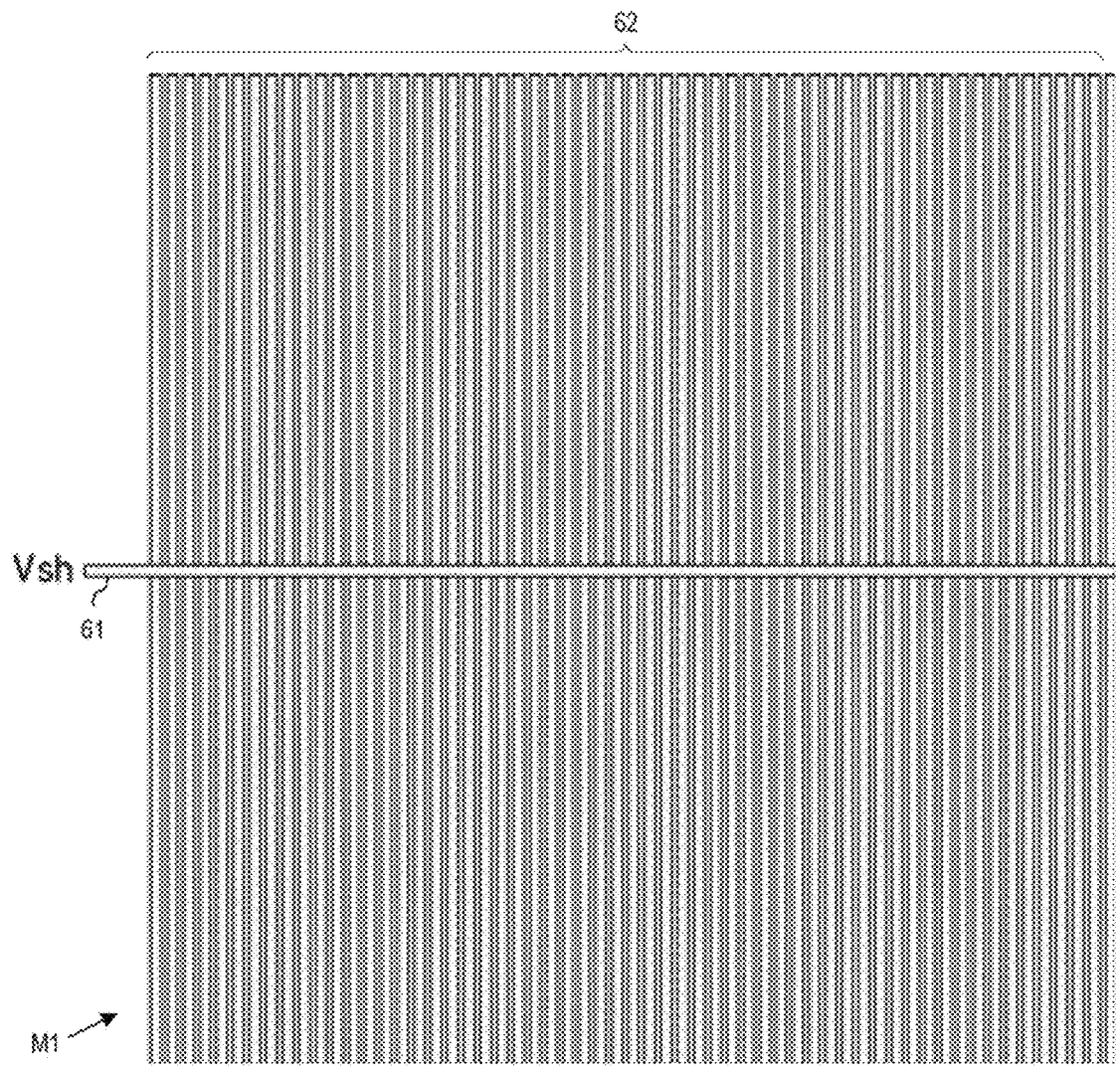
FIG. 6 depicts a plan or top view of a patterned first metal layer used to form an integrated circuit transformer in accordance with selected embodiments of the present disclosure.

Referring now to FIG. 6, there is depicted a plan or top view 60 of a patterned first metal layer M1 used to form an integrated circuit transformer in accordance with selected embodiments of the present disclosure. In this example, the first metal layer M1 may be formed into a patterned ground shield by patterning and etching the bottommost thin metal routing layer M1 to define a central shield track 61 and a plurality of parallel metal tracks 62 which are electrically connected to a ground or reference voltage Vsh. In particular, the central shield track 61 is defined and positioned in alignment with a transformer symmetry axis, and is electrically connected to the plurality of parallel metal tracks 62 which are oriented perpendicularly to extend from the transformer symmetry axis. By forming the patterned ground shield 61, 62 the lowest thin copper layer M1, the vertical distance between the transformer coils (formed in the upper conductive metal layers) and the patterned ground shield should be as large as possible.

As disclosed herein, the integrated circuit transformer will benefit from including a ground shield, such as a patterned ground shield 61, 62. The term "patterned" may refer to the ground shield 62 comprising a series of non-contiguous parallel electrically conductive bars, in this example having orientations transverse to the mirror symmetry plane along the central shield track 61. That is, the electrically conductive bars 62 may be close to each other, but not touching. Such a ground shield 61, 62 may reduce capacitive coupling to the substrate when the transformer is in operation. Capacitive coupling in this way could result in signal power loss due to the unfavorable substrate conductivity. Although the transverse orientation is considered the most effective, it will be appreciated that other orientations of the ground shield bars may be used that may obtain the advantages that the ground shield provides. As will be appreciated, the width and pitch of the ground shield bars may be chosen close to the thickness of the ground shield metal in order to minimize signal power loss due to current loops induced in the bars by the magnetic field of the transformer when the inductor/transformer is in operation, just as a current is induced in the secondary windings of the transformer.

In fabricating an inductor or transformer in an integrated circuit process, the distance between the coil windings and the substrate is typically a few microns. In certain processes, such as those using GaAs substrates, the substrate may be isolated. If, as in other IC processes, the substrate is silicon, then the substrate is semi-conductive. The magnetic field present when the inductor/transformer is in operation may induce current loops in the (semi-conductive substrate, just as a current is induced in the secondary windings of the transformer. In systems where the distance between the windings and the substrate is about a few microns, then capacitive coupling with the substrate can take place, which induces unwanted charges and currents in the (non-perfect isolating) substrate. An (induced) capacitance between the two terminals of the transformer windings can degrade the transformer performance and give rise to parasitic losses due to the current induced. Such parasitic losses from capacitive coupling may be mitigated by using a high substrate resistivity, or an isolating substrate; but this can be difficult to achieve in most silicon-based RF IC processes where the substrate resistivity is high enough (≥10 ohm-cm) that signal power loss due to eddy currents is negligible, but it is not high enough to also prevent the capacitive losses. That is why the patterned ground shield is included. These problems can be addressed by embodiments of the present invention by including a patterned lower metal layer between the substrate layer and the winding layers. By patterning the lower metal layer to include a series of non-contiguous conductive metal strips as the ground shield layer 61, 62, then the induction of circular loops in the shield layer will be greatly reduced and the performance of the transformer can be enhanced. Such strips in a ground shield may be fabricated in an IC process with a small width, for example of the order of one micron.

Figure 7:
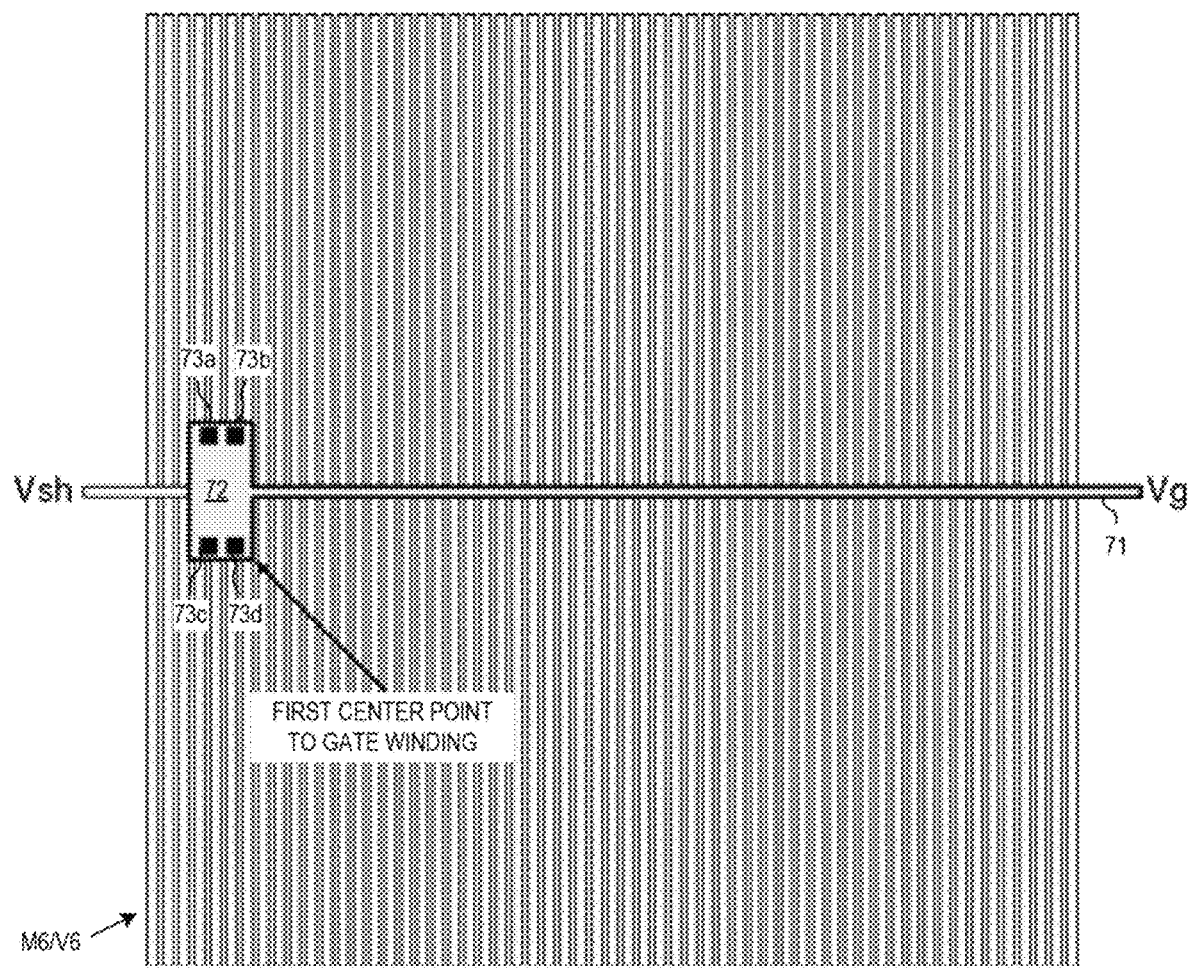
FIG. 7 depicts a plan view of a patterned second metal layer in the integrated circuit transformer at a level above that of FIG. 6.

Referring now to FIG. 7, there is depicted a plan or top view 70 of a patterned second metal layer M6 and conductive vias V6 in the integrated circuit transformer at a level above that of FIG. 6. In this example, no transformer features exist in the intermediate thin copper layers M2-M5. As depicted, the second metal layer M6 may be formed into a first track 71, 72 for connecting to a center point of the gate transformer coil by patterning and etching the topmost thin metal routing layer M6 to define a central track 71 and a first via contact plate 72 which are electrically connected to a gate voltage Vg. In particular, the central track 71 is defined and positioned in alignment with a transformer symmetry axis, and is electrically connected to the first via contact plate 72 which is positioned for alignment with and electrical connection to the (subsequently formed) first center point of the gate transformer coil. To enable the electrical connection to the (subsequently formed) first center point of the gate transformer coil, one or more conductive via structures 73*a-d* are formed over the second metal layer M6 to extend from the first via contact plate 72 using any suitable interconnect process. For example, a planarized ILD layer may be formed over the second metal layer M6 and then selectively patterned and etched to define openings in the ILD layer that expose the via contact plate 72, after which one or more conductive layers may be deposited into the defined openings and then polished or planarized to form the one or more conductive via structures 73*a-d* in the ILD layer. By routing the patterned first track 71, 72 along the symmetry axis of the transformer for connection to the center point of the gate coil, it will be at a virtual RF ground under differential operation. Therefore, this track can be used as gate bias voltage Vg connection.

Referring now to FIG. 8, there is depicted a plan or top view 80 of a patterned third metal layer M7 and conductive vias V7 in the integrated circuit transformer at a level above that of FIG. 7. As depicted, the third metal layer M7 may be formed into a supply voltage routing track 81 for connecting to a center point of the drain transformer coil by patterning and etching a first relatively thick metal routing layer M7 to define first and second feed line conductors 81A, 81B, a second via contact plate 81G, and supply voltage routing tracks 81C-81F which are electrically connected to route a supply voltage Vdd to the first and second feed line conductors 81A, 81B second via contact plate 81G. In addition, the patterned third metal layer M7 defines one or more third via contact plates 82, 83 which are electrically connected to the underlying first via contact plate 72 using conductive via structures 73*a-d*, and which are not electrically connected to the supply voltage routing track 81. In particular, the first and second feed line conductors 81A, 81B are defined and positioned in alignment with the transformer symmetry axis, and are electrically connected to the second via contact plate 81G which is positioned for alignment with and electrical connection to the (subsequently formed) second center point of the drain transformer coil. To enable the electrical connection to the (subsequently formed) second center point of the drain transformer coil, one or more conductive via structures V8 are formed over the third metal layer M7 using any suitable interconnect process. For example, one or more conductive via structures (e.g., 87*e*, 87*f*) are formed in electrical contact with the via contact plate 81G. Likewise, one or more conductive via structures (e.g., 87*a*-87*d*) are formed over the third via contact plates 82, 83 using any suitable interconnect process to enable the electrical connection to the (subsequently formed) first center point of the gate transformer coil. By routing the supply voltage routing track 81 along or symmetric with respect to the symmetry axis of the transformer for connection to the center point of the drain coil, they will be at a virtual RF ground under differential operation. Therefore, these tracks can be used as a drain bias voltage connection.

Referring now to FIG. 9, there is depicted a plan or top view 90 of a patterned fourth metal layer M8 and conductive vias V8 in the integrated circuit transformer at a level above that of FIG. 8. As depicted, the fourth metal layer M8 may be formed into a lower primary/gate and secondary/drain coil windings 91, 92 are formed by patterning and etching a second relatively thick metal routing layer M8. As formed, the lower primary/gate coil winding 91 includes a first center point 95 on one end, and a pair of gate terminals 91A, 91B on the opposite end for connection to the negative and positive gates G−, G+ of the next amplification stage. Similarly, the lower secondary/drain coil winding 92 is formed with a second center point 96 on one end, and a pair of terminals 92A, 92B on the opposite end for connection to the positive and negative drains D+, D− of the preceding amplification stage. To enable this connection to the previous stage, the patterned fourth metal layer M8 also includes separately defined via contact plates 93, 94 which are electrically connected positive and negative drains of the preceding amplification stage. As formed, the via contact plates 93, 94 are not electrically connected to the other layers of the integrated circuit transformer. However, the first center point 95 at the lower primary/gate coil winding 91 is electrically connected to the gate voltage Vg on the underlying first track 71, 72 by the conductive via structures 87a-87d and third via contact plates 82, 83. Likewise, the second center point 96 at the lower secondary/drain coil winding 92 is electrically connected to the drain voltage Vdd on the underlying supply voltage routing track 81 by the conductive via structures 87e-87f and second via contact plate 81G. In particular, the lower primary/gate coil 91 and the lower secondary/drain coil 92 are formed in the second relatively thick metal layer M8 as concentric windings, each having different radii. As a result, the terminal ends 92A, 92B the lower secondary/drain winding 92 should pass into a different layer to make electrical contact with the D+, D− of the terminal pair 93, 94 to avoid contact with the primary/gate winding 91. To enable the electrical connection to other layers, one or more conductive via structures V8 are formed over the fourth metal layer M8 using any suitable interconnect process. For example, one or more conductive via structures (e.g., 97a-97d) are formed in electrical contact with the via contact plates 93, 94. Likewise, a first set of conductive via structures (e.g., 98a-98d) is formed over the lower primary/gate winding 91 and a second set of conductive via structures (e.g., 99a-99f) is formed over the lower secondary/drain winding 92 lower primary/gate and secondary/drain coil windings 91, 92 using any suitable interconnect process.

Referring now to FIG. 10, there is depicted a plan or top view 100 of a patterned fifth metal layer M9 in the integrated circuit transformer at a level above that of FIG. 9. As depicted, the fifth metal layer M9 may be formed into an upper primary/gate coil winding 101 and a secondary/drain coil winding 102 by patterning and etching a topmost relatively thick metal routing layer M9. As depicted, the upper primary/gate coil winding 101 includes first curve-shaped top metal winding layer 111 and a second curve-shaped top metal winding layer 112 formed in the fifth metal layer M9 to be disposed symmetrically about the symmetry axis of the transformer, with a first center point 105 on one end, and a pair of gate terminals 111A, 112A on the opposite end for connection to the negative and positive gates G−, G+ of the next amplification stage. Similarly, the upper secondary/drain coil winding 102 includes a concentric, circularly-shaped top metal winding layer 113 formed in the fifth metal layer M9 to be disposed symmetrically about the symmetry axis of the transformer, with a second center point 106 on one end, and a pair of terminals 113A, 113B on the opposite end for connection to the positive and negative drains D+, D− of the preceding amplification stage. Ideally, the shape and positioning of the upper primary/gate coil winding 101 and a secondary/drain coil winding 102 correspond substantially to the shape and positioning of the lower primary/gate coil winding 91 and a secondary/drain coil winding 92. As illustrated, the transformer coil 101 with the larger diameter crosses under the transformer coil 102 with the smaller diameter at the terminal pair 113A, 113B, and therefore the first center point 105 for the transformer coil 101 is contacted from the lower metal layers. As a result, the first center point 105 for the primary/gate coil winding 101 is physically located in the lower primary/gate coil 91 where it is electrically connected to the gate voltage Vg on the underlying first track 71, 72 by the conductive via structures 87a-87d and third via contact plates 82, 83. Likewise, the second center point 106 at the upper secondary/drain coil winding 102 is electrically connected to the drain voltage Vdd on the underlying supply voltage routing track 81 by the conductive via structures 99a-99f, the lower drain coil 92, the conductive via structures 87e-87f, and second via contact plate 81G. Additional crossings are used for transformers where the coils have multiple turns to increase their inductance. And to maximize inductive coupling, turns belonging to the primary and secondary coils should alternate, respectively. Where no crossings are needed, the two transformer coils can be located in the two highest metal layers (e.g., M8, M9).

As mentioned above, the long wires which are used to connect to the coil center points are sensitive to electro-migration damage when current density is too high. Persons skilled in the art will appreciate that electro-migration is the effect where atoms of a copper or aluminium interconnect wire are slowly displaced by the steady flow of electrons. With the displacement along the wire resulting in an accumulation of metal atoms at the end of the line, this can cause the line to break at the opposite end. For low electron current densities, the atoms can diffuse back to their original position before damage can build up. Also, AC currents can be neglected in an electro migration evaluation. However, electro-migration damage can build up for DC currents when the circuit is in operation. Since this effect is most pronounced for the first center point conductor to the drain winding, the layers for the first and second feed line conductors should have specified minimum width dimensions to ensure that safe current density limits are not exceeded for the integrated circuit transformer. As an example, the table below lists the sheet resistances and EM safe reference currents for the metal layers of a transformer example:

| Thickness | Metal | Atom. Mass | $R_{sheet}$ Ω | $I_{max}$ mA/μm | $I_{max}$ mA/μm$^2$ |
| --- | --- | --- | --- | --- | --- |
| 85 nm | copper | 63 | 0.24 | 0.94 | 10.5 |
| 850 nm | copper | 63 | 0.023 | 8.14 | 9.58 |
| 2800 nm | aluminum | 27 | 0.01 | 5.21 | 1.86 |

As seen above, the lower atomic mass of aluminum means that its safe current density ($I_{max}$ mA/μm$^2$) is considerably lower than for copper, and therefore despite their larger thickness (2800 nm), aluminum wires can carry less current than thinner (850 nm) copper wires of the same width. At the same time, when a transformer coil has a thick copper track and an aluminum track in parallel, approximately 70% of the current will flow in the aluminum track since the current distributes between them according to their relative resistances. So, in the end, a single thick copper track, and one with an aluminum track in parallel, may have approximately the same safe current levels.

For an improved understanding of selected embodiments of the present disclosure, reference is now made to FIG. 10 which depicts the critical dimensions for the metal layers of a transformer 100, including a first width dimension W1 for the width of the drain terminals (e.g., 113A), a second width dimension W2 for the width of the secondary coil winding (e.g., 113), a third width dimension W3 for the width of the feed line conductors (e.g., 81A, 81B), and a fourth width dimension W4 for the width of the supply voltage routing tracks (e.g., 81C-81F). As an example in which the integrated circuit transformer of FIG. 3 is formed with 85 nm copper layers M1-M6, 850 nm copper layers M7-M8, and 2800 nm aluminum layer M9, then the minimum track widths W1-W4 required to provide a total safe reference drain current as high as 100 mA would be listed in the table below:

| Dimension | Current | Metal | Wmin |
|---|---|---|---|
| W1 | 50 mA | Al | 9.6 μm |
| W2 | 50 mA | Al ∥ Cu | 6.7 μm |
| W3 | 50 mA | Cu | 6.2 μm |
| W4 | 25 mA | Cu | 3.1 μm |

With these example widths, all of the metal tracks of the transformer layout are equally robust against electro-migration damage.

In order to ensure that the current is able to conduct from one metal layer to the other, the current is divided over a sufficient amount of conductive via structures. Typically, the 3×3 μm via structures interconnecting the aluminum and the copper layer can carry 12 mA each. So, the number of via structures shown in the drawings can do the job. The 0.36×0.36 μm via structures interconnecting the two thick copper layers M7, M8 can carry 3 mA each, but they can be placed with a much higher density, so they can do the job as well. As will be appreciated, other dimensional values and arrangements may be used to achieve the desired electrical interconnection.

To provide additional details for an improved understanding of selected embodiments of the present disclosure, reference is now made to FIG. 11 which depicts a simplified cross-sectional side view 110 through the first center point 105 of the outer or primary/gate coil in the integrated circuit transformer shown in FIG. 10, as indicated with the perspective view labeled "FIG. 11". As will be appreciated, the size and spacing of the individual conductive metal layers may be exaggerated and not drawn on scale for illustrative purposes. In the depicted view 110, the ground shield layer 62 is formed in a first thin copper layer M1. In addition, the via contact plate 72 is formed in a second thin metal layer M6 and connected to the outer gate winding layer 91 (formed in the second thick copper layer M8) and to the outer gate winding layers 111, 112 (formed in the thick aluminum layer M9) using conductive interconnect structures (e.g., 73*a-d*, 82-83, 87*a-d*, 98*a-d*) formed in the intervening layers. Finally, the feed line conductor 81A is formed in the first thick copper layer M7 and connected to the inner drain winding layer 113 using conductive interconnect structures (not shown). Collectively, the conductive layers 72, 82, 81A, 83 and their conductive vias 73*a-d*, 87*a-d* form an underlying interconnect structure 121 for connecting the via contact plate 72 to the gate winding.

In similar fashion, FIG. 12 depicts a simplified cross-sectional side view 120 through the second center point 106 of the inner or secondary/drain coil in the integrated circuit transformer shown in FIG. 10, as indicated with the perspective view labeled "FIG. 12". Again, the size and spacing of the individual conductive metal layers may be exaggerated and not drawn on scale for illustrative purposes. In this view 120, the ground shield layer 62 is formed in a first thin copper layer M1. In addition, the second via contact plate 81G which is positioned between feed line conductors 81A, 81B is formed in the first thick copper layer M7 and connected to the inner drain winding layer 92 (formed in the second thick copper layer M8) and to the inner drain winding layer 113 (formed in the thick aluminum layer M9) using conductive interconnect structures (e.g., 87*e-f*, 99*a-d*) formed in the intervening layers. Finally, the central track 71 is formed in a second thin metal layer M6 and connected to the outer gate winding layer (not shown) using conductive interconnect structures (not shown). Collectively, the conductive layers 81G and the conductive vias 87*e-f* form an underlying interconnect structure 122 for connecting the feed line conductors 81A, 81B to the drain winding.

In FIG. 11, the gate coil center tap is located at the center of the lower primary/gate coil winding 91, and in FIG. 12, the drain coil center tap is located at the center of the secondary/drain coil winding layers 92, 113. Since the wire connecting to the outer gate coil does not to carry any DC current, it can be formed with a very narrow conductor layer, such as a thin (e.g., 85 nm) copper layer which forms the via contact plate 72 (FIG. 11) and the central track 71 (FIG. 12) which connect to the outer gate winding coil. Conversely, the wire connecting to the inner drain coil must carry the average drain current, and should therefore be formed with a robust conductor layer that has, at a minimum, approximately the same width and thickness as the transformer coil, such as the thick (e.g., 850 nm) copper layer which forms the feed line conductors 81A, 81B (FIG. 11) and second via contact plate 81G (FIG. 12) which connect to the inner drain winding coil.

Figure 13:
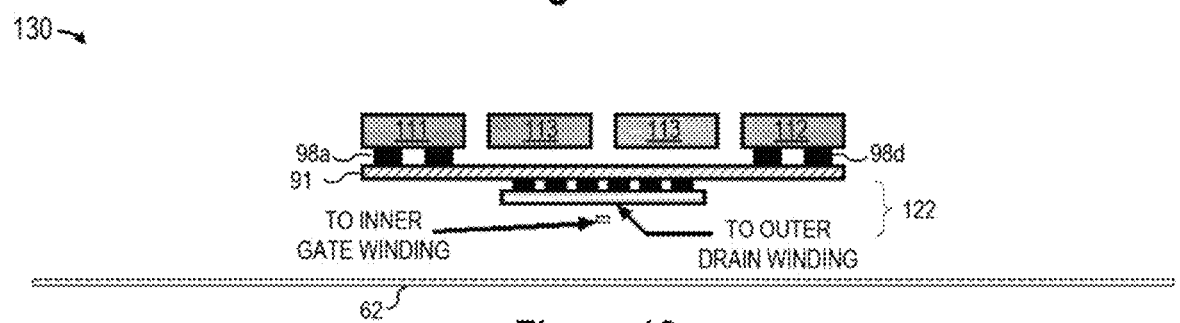
FIG. 13 depicts a simplified cross-sectional side view through a center point of the outer drain coil in the integrated circuit transformer in accordance with selected embodiments of the present disclosure.
Figure 14:
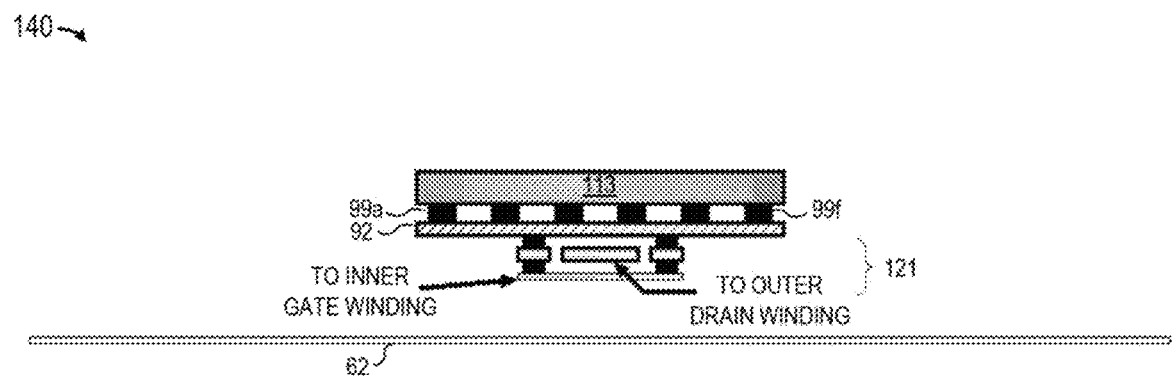
FIG. 14 depicts a simplified cross-sectional side view through a center point of the inner gate coil in the integrated circuit transformer in accordance with selected embodiments of the present disclosure.

As will be appreciated, there will be situations where center point connections to the coils must be swapped, such as when the outer or primary coil in the integrated circuit transformer is connected to the drain node which carries DC current, and the inner or secondary coil is connected to the gate node which carries AC current. This is illustrated in FIGS. 13 and 14 which show cross-sections through the gate and drain coil center tap points that are connected, respectively to the outer drain coil and inner gate coil. In particular, FIG. 13 depicts a simplified cross-sectional side view 130 through a first center point of the outer or primary/drain coil in the integrated circuit transformer in accordance with selected embodiments of the present disclosure. In the depicted view 130, the ground shield layer 62 is formed in a first thin copper layer M1. In addition, the underlying interconnect structure 122 (similar to FIG. 12) is formed in the second thin metal layer M6 and first thick copper layer M7 for connecting the feed line conductors 81A, 81B (formed in the first thick copper layer M7) to the outer drain winding layer conductors 91 (formed in the second thick copper layer M8) and 111, 112 (formed in the top aluminum layer M9) through conductive via structures 98*a-d*.

In addition, FIG. 14 depicts a simplified cross-sectional side view 140 through a second center point of the inner or secondary/gate coil in the integrated circuit transformer in accordance with selected embodiments of the present disclosure. In the depicted view 140, the underlying interconnect structure 121 (similar to FIG. 11) is formed in the second thin metal layer M6 and first thick copper layer M7 for connecting the via contact plate 72 to the inner gate winding layer 92 (formed in the second thick copper layer M8) and to the gate winding layer 113 (formed in the thick aluminum layer M9).

Figure 15:
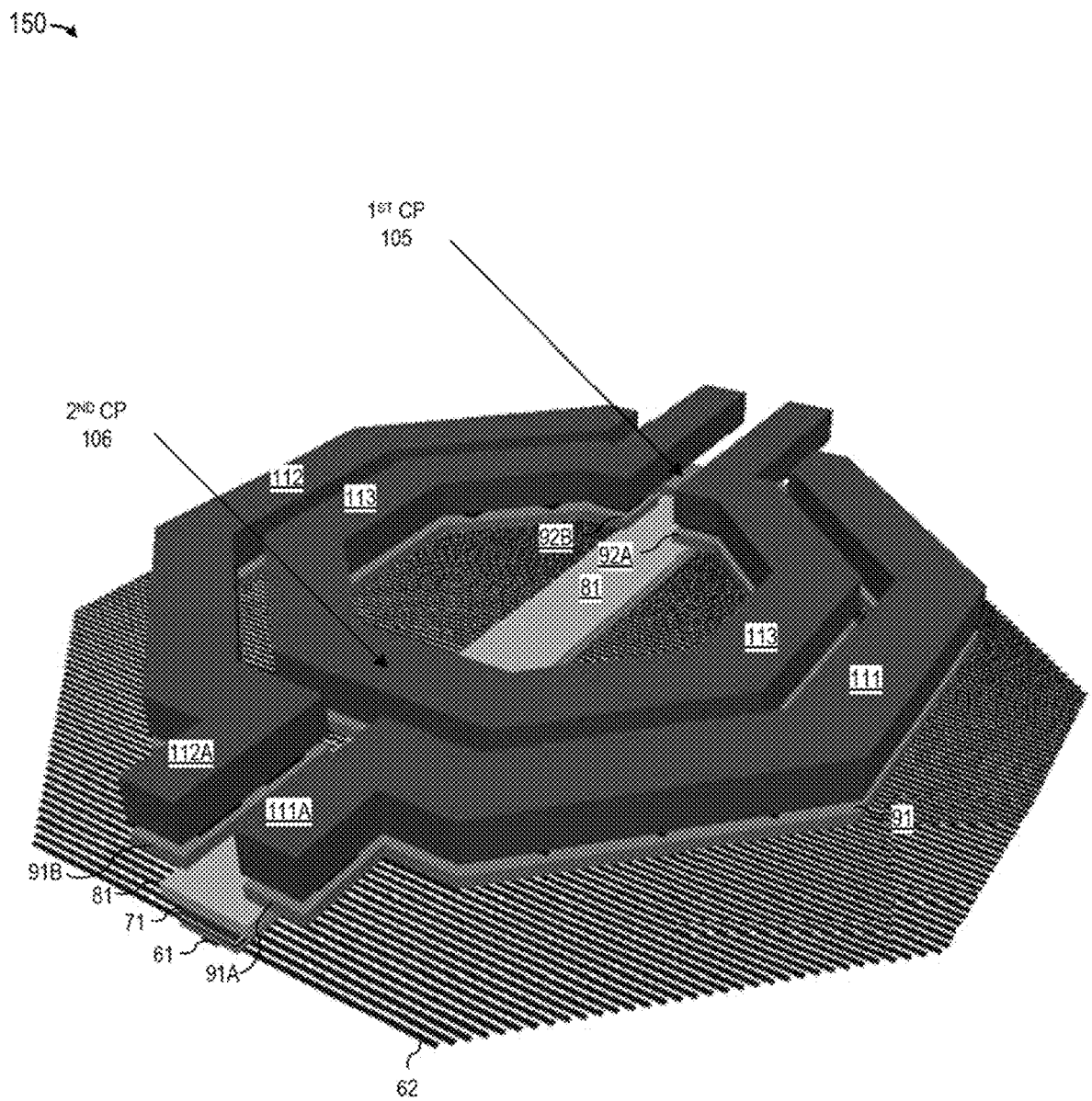
FIG. 15 depicts a perspective view of an integrated circuit transformer in accordance with selected embodiments of the present disclosure.

To provide additional details for an improved understanding of selected embodiments of the present disclosure, reference is now made to FIG. 15 which depicts a perspective view 150 of an integrated circuit transformer which is fabricated by a process which is illustrated with reference to the FIGS. 6-10. While the dimensions of individual features in FIG. 15 do not correspond exactly to the dimensions illustrated in FIGS. 6-10, the perspective view 160 shows that an underlying patterned ground shield 61, 62 is formed in a first local metal routing layer. In one or more upper local metal routing layers, a first patterned track 71 is formed for connecting to a center point 105 of the gate transformer coil across a first via contact plate (not shown). In a first, thicker global metal routing layer, a patterned supply voltage routing track 81 is formed for connecting to a center point of the drain transformer coil over the thicker global metal routing layer to define feed line conductors along the symmetry axis of the transformer and along the periphery (not shown) for routing a supply voltage Vdd to the center point of the drain transformer coil 106. In a second, thicker global metal routing layer, a patterned lower gate coil 91 and concentric inner lower drain coil 92 are formed to be disposed symmetrically about the symmetry axis of the transformer. As shown, the patterned lower gate coil 91 includes a first center point 105 on one end of the patterned lower gate coil 91, and a pair of drain terminals 91A, 91B on the opposite end for connection to the negative and positive gates G–, G+ of the next amplification stage. Similarly, the lower drain winding 92 includes a concentric, circularly-shaped top metal winding layer with a second center point 106 on one end, and a pair of terminals 92A, 92B on the opposite end for connection to the positive and negative drains D+, D– of the preceding amplification stage. And in the topmost, thickest metal routing layer, a patterned upper gate coil 111, 112 and concentric inner upper drain coil 113 are formed to be disposed symmetrically about the symmetry axis of the transformer and connected to the underlying patterned lower gate coil 91 and concentric inner lower drain coil 92.

Figure 16:
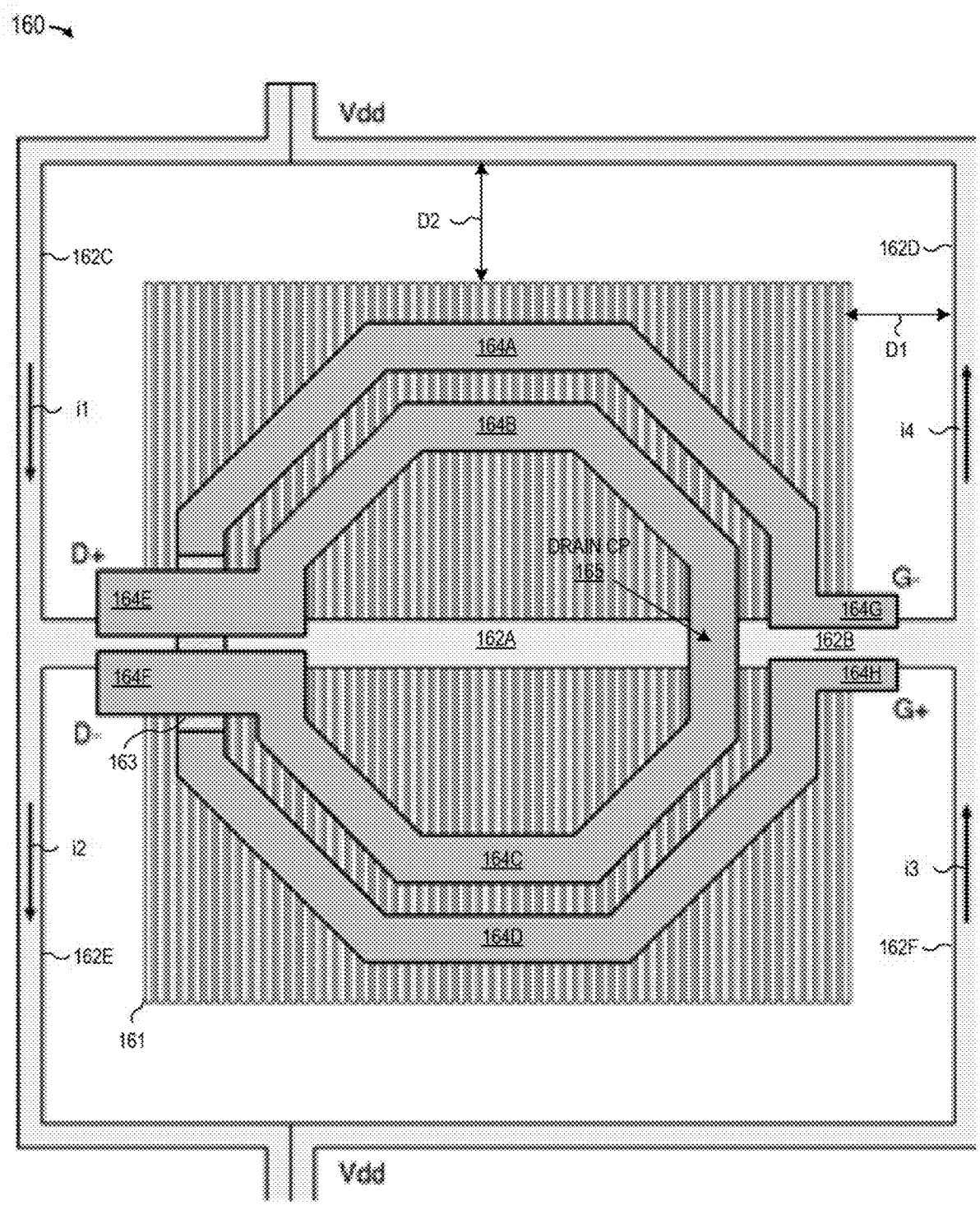
FIG. 16 depicts a plan view of the patterned metal layers in an integrated circuit transformer where the drain voltage supply conductors are spaced apart from the transformer in accordance with selected embodiments of the present disclosure.

As disclosed herein, the use of a supply voltage routing track formed in the first relatively thicker (copper) conductor layer (e.g., M7) to supply the voltage at the center point of the inner drain coil from several sides results in a current loop being formed. To illustrate this current loop, reference is now made to FIG. 16 which depicts a plan view 160 of the patterned metal layers 161-164 in an integrated circuit transformer where the drain voltage supply conductors 162A-F supply the voltage Vdd to the drain center point 165. In this situation, RF current running clockwise from the D+ terminal 164E to the D– terminal 164F will induce an opposite RF current i1-i4 in the drain voltage supply conductors 162C-162F. To prevent the induced current from adversely impacting transformer performance, the integrated circuit transformer may be designed to ensure that the parasitic loop inductance L is sufficiently large and the mutual inductance M to the drain coil is sufficiently small. In most cases, the ratio L/M>10 will be sufficient. To achieve this result, at least the vertical drain voltage supply conductors 162C-162F may be spaced apart from the transformer by a lateral spacing distance D1 that is approximately $1/10^{th}$ to $1/4^{th}$ of the outer transformer diameter. Furthermore, the horizontal drain voltage supply conductors may also be spaced apart from the transformer by a minimum vertical spacing distance D2 that is approximately halve to twice the outer transformer diameter. And since the Vdd voltage supply conductor 162A, 162B that runs along the symmetry axis of the transformer is at a virtual ground for differential signals, it is beneficial to position the MOS devices of the output and input stages close to the Vdd voltage supply conductor 162A, 162B, and in symmetrical relation to the transformer symmetry axis. As disclosed herein, it is beneficial to use the Vdd voltage supply conductor 162A, 162B in the thick copper layer as ground reference on both sides of the transformer since it has a lower resistance than the central bar (e.g., central shield track 61) in the thin copper patterned ground shield.

Figure 17:
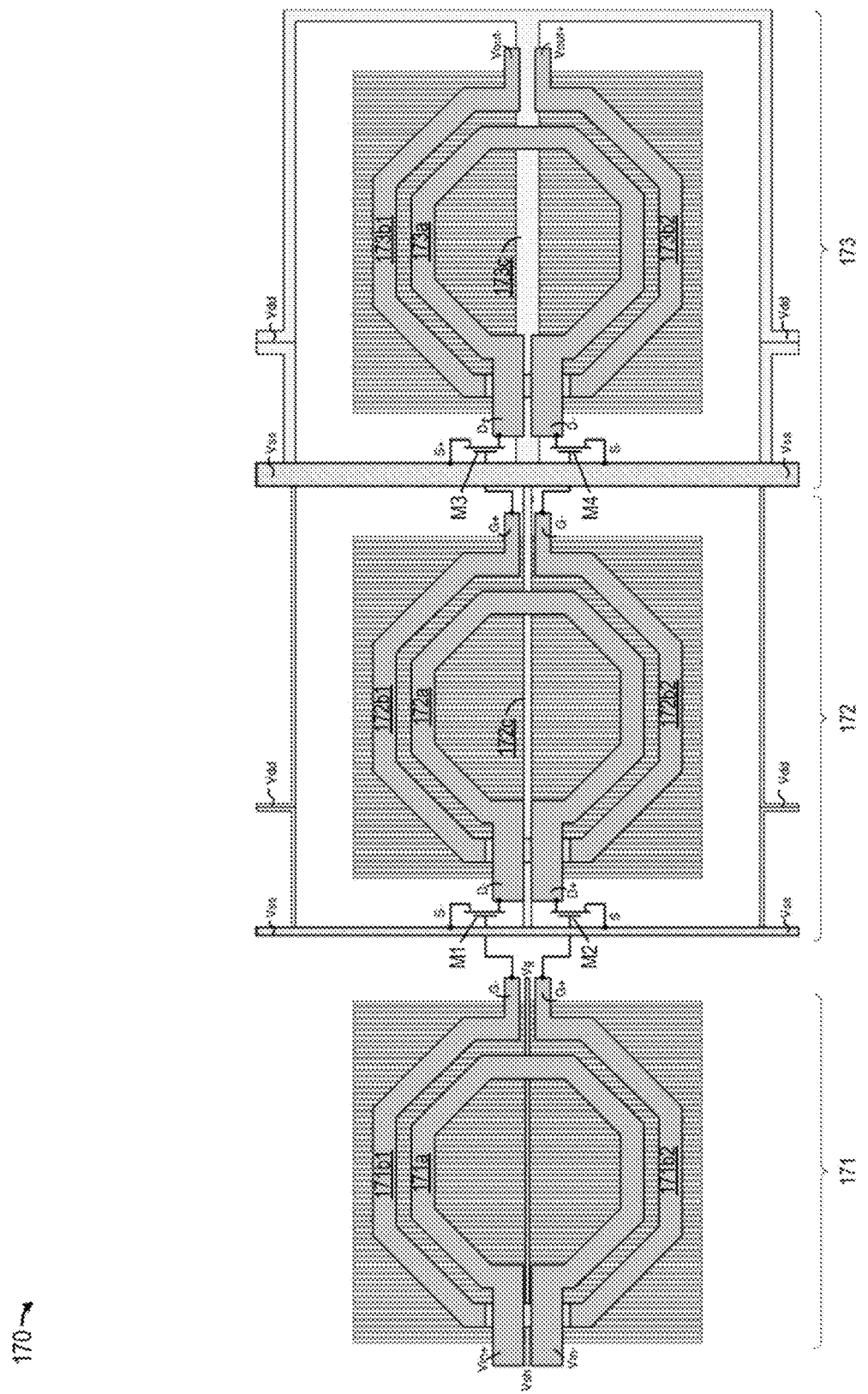
FIG. 17 depicts a two-stage three-transformer differential amplifier in accordance with selected embodiments of the present disclosure.

As disclosed herein, the integrated circuit transformers may be deployed in a variety of configurations and circuit arrangements, and are especially attractive for inter-stage impedance matching and energy efficiency in the differential power amplifier stages where the transformer can withstand the high DC drive currents which occur in high power (50 mW) high frequency (78 GHz) amplifier stages. To provide an example circuit arrangement, reference is now made to FIG. 17 which depicts a two-stage three-transformer differential amplifier 170 in accordance with selected embodiments of the present disclosure. For illustration purposes, the circuitry to supply the gate bias is not shown. Also, decoupling and tuning capacitors are not shown. In addition, the transformer coil dimensions are shown as being equal for all three stages, but they may have different diameters, widths and spacing.

As depicted, the differential amplifier 170 includes a first stage input transformer 171 which is connected to receive differential input signals Vin+ and Vin– at the input terminals of the inner coil 171a for inductively coupling with the outer coil(s) 171b to generate the output signals G+ and G– at the output terminals of the outer coil 171b1-2. Since the first stage input transformer 171 does not need a tap on the center point of the inner coil 171a, there are no feed line conductors required, but the first stage input transformer 171 does include underlying patterned ground shield (connected to Vsh) and first track for connecting the center point of the outer coil (connected to Vg).

The differential amplifier 170 also includes a second stage transformer 172 which is connected to receive differential input drain signals D+ and D– at the input terminals of the inner coil 172A for inductively coupling with the outer coil(s) 172b to generate the output signals G+ and G– at the output terminals of the outer coil 172b1-2. As depicted, the differential input drain signals D+ and D– are generated by the NFET transistors M1, M2 which are gated, respectively, by the output signals G+ and G– from the first stage input transformer 171 to connect the supply voltage Vss to the input terminals D+ and D– of the inner coil 172A. Though not visible, the second stage transformer 172 does include underlying patterned ground shield (connected to Vsh) and first track for connecting the center point of the outer coil (connected to Vg). In addition, since the second stage transformer 172 includes a tap on the center point of the inner coil 172a, there is also a central feed line conductor 172c formed in the relative thick copper layer for connecting the drain coil center point to the supply voltage Vdd.

Finally, the differential amplifier 170 includes a third stage transformer 173 which is connected to receive differential input drain signals D+ and D– at the input terminals of the inner coil 173A for inductively coupling with the outer coil(s) 173b to generate the output signals Vout−, Vout+ at the output terminals of the outer coil 173b1-2. As depicted, the differential input drain signals D+ and D− for the third stage transformer 173 are generated by the NFET transistors M3, M4 which are gated, respectively, by the output signals G+ and G− from the second stage transformer 172 to connect the supply voltage Vss to the input terminals D+ and D− of the inner coil 173A. Though not visible, the third stage transformer 173 also includes underlying patterned ground shield (connected to Vsh) and first track for connecting the center point of the outer coil (connected to Vg). In addition, the third stage transformer 173 includes a tap on the center point of the inner coil 173a which is connected over a central feed line conductor 173c formed in the relative thick copper layer for connecting the drain coil center point to the supply voltage Vdd. As depicted, at least the Vss and Vdd leads of the third stage transformer 173 are wider than those of the second stage transformer 172, since the power and thus the drive current in the second stage will be larger.

As disclosed herein, selected embodiments of the integrated circuit transformer devices may be formed with multi-turn transformers wherein multiple crossings are formed in the top metal layers. To provide additional details for an improved understanding of selected embodiments of the present disclosure, reference is now made to FIG. 18 which depicts a plan view 180 of the patterned metal layers 181-188 and conductive via structures 189, 193 used to form a 2×1 integrated circuit transformer. In the plan view 180, the visible portions of the patterned metal layers 181-188 are shown along with the locations of the conductive via structures 189 and drain central tap vias 193. From this perspective, it will be appreciated that the metal interconnect M1-M9 are sequentially deposited, patterned, and etched over intervening inter-layer dielectric (ILD) layers using any suitable backend process which includes the ability to form conductive via structures between different metal interconnect layers to establish required electrical connections. For example, a first relatively thin metal interconnect layer M1 may be patterned to form a ground shield (not shown) in the lowest metal interconnect layer over a base or bottom passivation or dielectric layer. After forming one or more intervening ILD layers ILD1-5 and metal interconnect layers (e.g., M2-M5), a second relatively thin metal interconnect layer M6 may be patterned to form a gate center tap (CT) bar 182 which extends along the symmetry axis of the transformer and which includes a via contact plate for making electrical connection across the subsequently-formed gate center tap vias V6 (not shown) to connect to the gate center tap 192. After forming an intervening ILD layer ILD6 and any required interconnecting via structures V6, a first relatively thick metal interconnect layer M7 may be patterned to form a drain center tap bar 183 which extends along the symmetry axis of the transformer and which includes a via contact plate for making electrical connection across the subsequently-formed drain center tap vias V7 193 to connect to the drain center tap 191.

After forming an intervening ILD layer ILD7 and any required interconnecting via structures V7, a second relatively thick metal interconnect layer M8 may be patterned to form concentric primary gate windings 185A-B on the inner and outer sides of a secondary drain winding 184 having a generally circular shape. To provide cross under paths for the primary and secondary windings, the secondary drain winding 184A and drain winding terminal 184B in the relatively thick metal interconnect layer M8 may be formed as a circularly-shaped metal winding layer with one or more gaps or openings through which the primary gate winding 185B may extend. In the same fashion, the concentric primary gate windings 185A, 185B in the relatively thick metal interconnect layer M8 may be formed as a pair of circularly-shaped metal winding layers with one or more gaps or openings through which the secondary drain winding 184A may extend, thereby allowing the concentric primary gate windings 185A, 185b to be formed on both sides of the secondary drain winding 184A.

After forming an intervening ILD layer ILD8 and any required interconnecting via structures V8, an upper relatively thick metal interconnect layer M9 may be patterned to form concentric primary gate windings 187A-B on the inner and outer sides of a secondary drain winding 186 having a generally circular shape. As formed, the shape and position of the primary gate windings 187A-B and a secondary drain winding 186 conform substantially to the shape and position of the underlying primary gate windings 185A-B and a secondary drain winding 184A. To provide cross over paths for the primary and secondary windings, the secondary drain winding 186 and drain winding terminal 188A in the upper relatively thick metal interconnect layer M9 may be formed as a circularly-shaped metal winding layer with one or more gaps or openings through which the primary gate winding 187A may extend. In the same fashion, the concentric primary gate windings 187A, 187B in the upper relatively thick metal interconnect layer M9 may be formed as a pair of circularly-shaped metal winding layers with one or more gaps or openings through which the secondary drain winding 186 may extend, thereby allowing the concentric primary gate windings 187A, 187b to be formed on both sides of the secondary drain winding 186.

By patterning and positioning the concentric primary gate windings 185, 187 to surround the inner and outer sides of the secondary drain windings 184, 186, a 2×1 transformer is formed which has an axis of symmetry that extends along the drain center tap bar 183. And by defining the winding diameter and width to allow for multiple conductive via structures 189, the defined layers in the second, relatively thick metal interconnect layer M8 and upper relatively thick metal interconnect layer M9 are electrically connecting to form the primary gate windings and secondary drain windings. In addition, the symmetry and positioning of the layers 185, 187 used to form the primary gate windings create a gate center tap point 192 which is aligned for electrical connection to the M6 gate center tap bar 182. Likewise, the symmetry and positioning of the layers 184, 186 used to form the primary drain windings create a drain center tap point 191 which is aligned for electrical connection to the M7 drain center tap bar 183.

Figure 18:
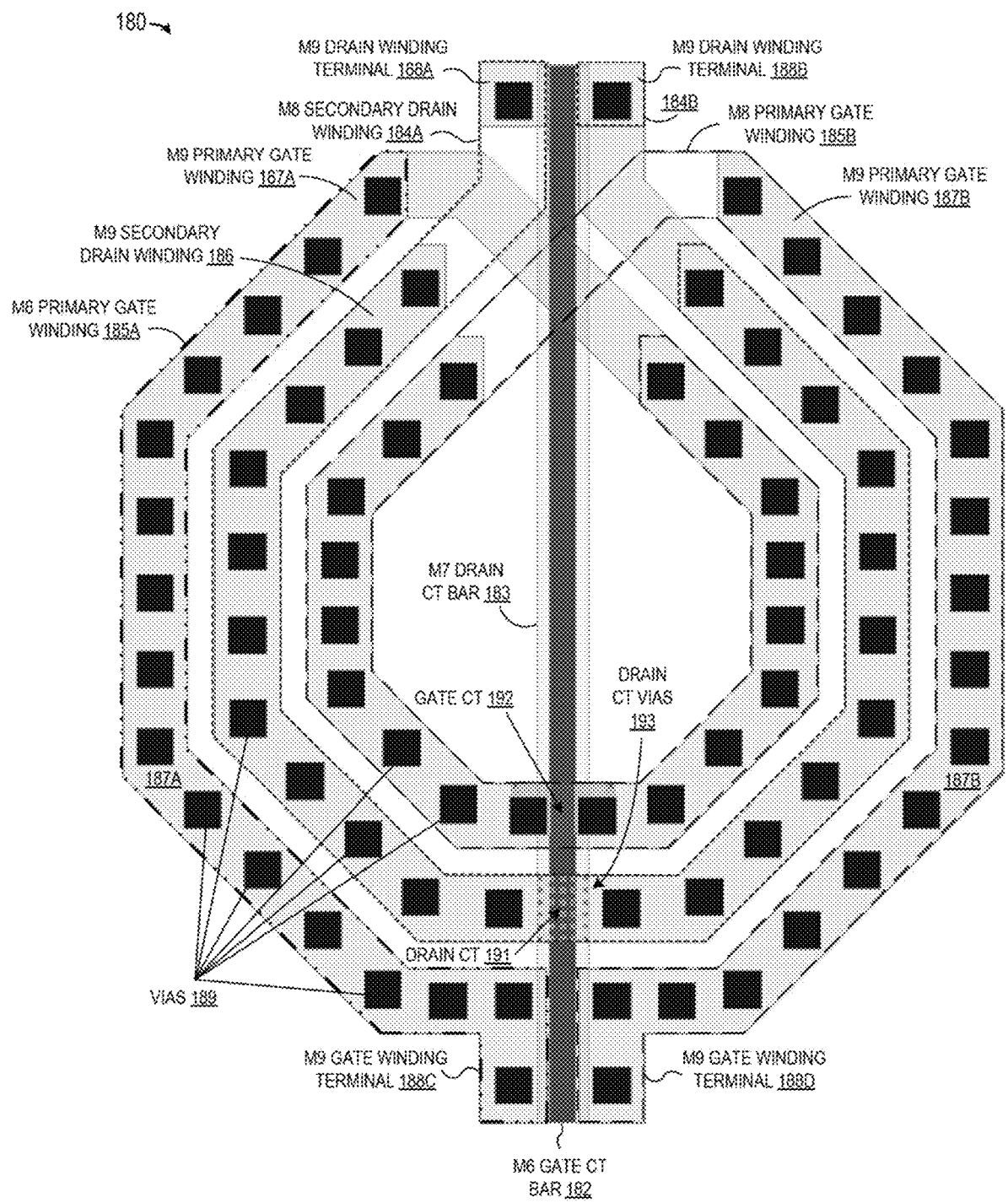
FIG. 18 depicts a plan view of the patterned metal layers in a 2×1 integrated circuit transformer in accordance with selected embodiments of the present disclosure.
Figure 19:
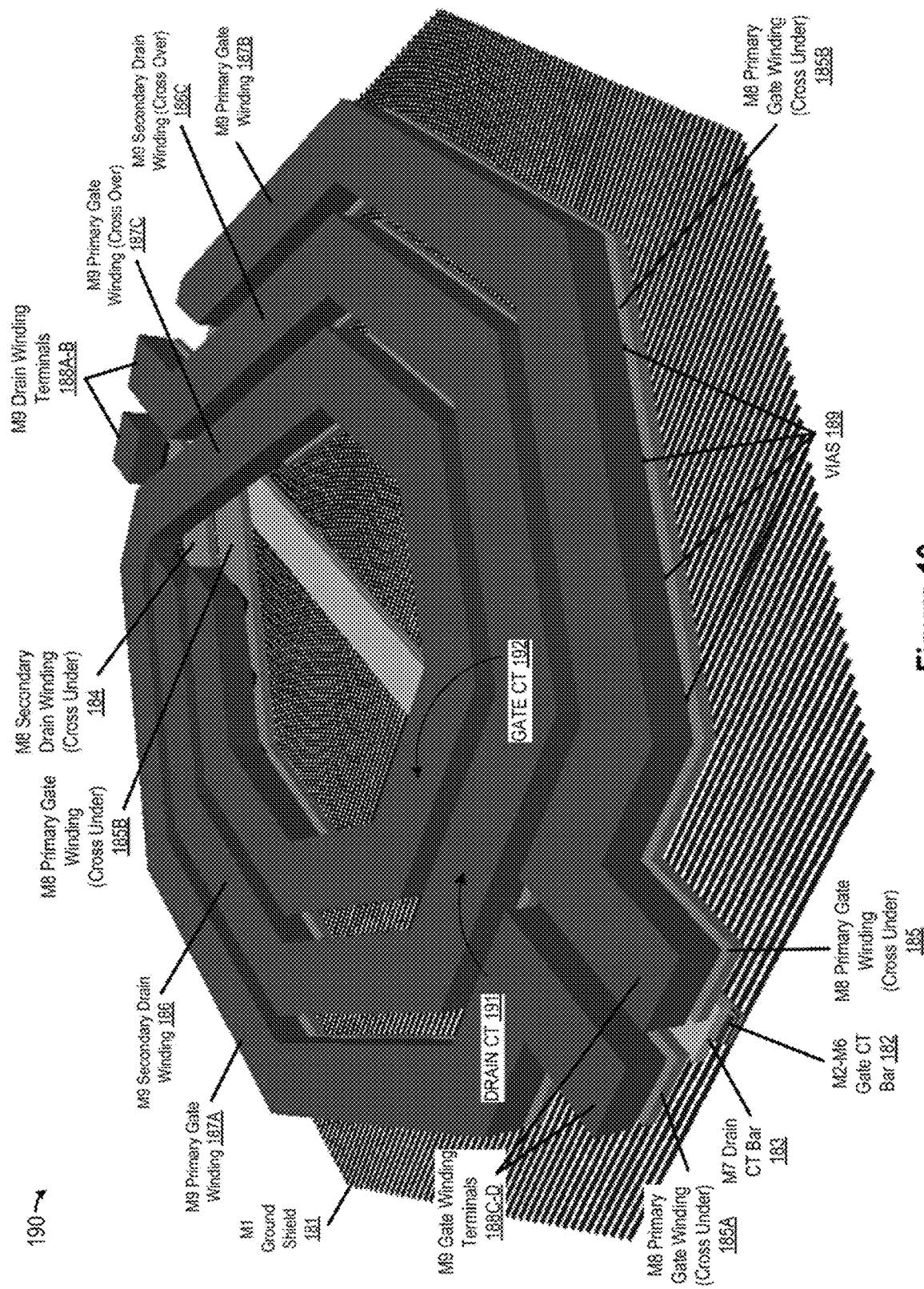
FIG. 19 depicts a perspective view of the integrated circuit transformer shown in FIG. 18.

To provide additional details for an improved understanding of selected embodiments of the present disclosure, reference is now made to FIG. 19 which depicts a perspective view 190 of the integrated circuit transformer shown in FIG. 18. As depicted, the underlying patterned ground shield 181 is formed in a first, relatively thin local metal routing interconnect layer M1. In one or more upper, relatively thin local metal interconnect layers M2-M6, a first patterned gate center tap bar 182 is formed along the symmetry axis of the transformer with a first via contact plate (not shown) for connecting to a center tap point 192 of the subsequently formed gate transformer coil windings 185, 187. In a first, thicker global metal interconnect layer M7, a second patterned drain center tap bar 183 is formed along the symmetry axis of the transformer with a second via contact plate (not shown) for connecting to a center tap point 191 of the subsequently formed drain transformer coil windings 184,

186. In a second, thicker global metal routing interconnect layer M8, a patterned lower drain coil 184 and concentric lower gate coil 185A, 185B are formed to be disposed symmetrically about the symmetry axis of the transformer. As shown, the patterned lower drain coil segment 184 forms a generally circular loop, and includes a pair of drain terminals 188A, 188B on one end of the patterned lower drain coil, and a drain center tap point 191 on the opposite end for connection to the patterned drain center tap bar 183. Similarly, the patterned lower gate coil segments 185A, 185B include concentric, circularly-shaped metal winding layers with a pair of gate terminals 188C, 188D on one end of the patterned lower gate coil, and a gate center tap point 192 on the opposite end for connection to the patterned gate center tap bar 182. And in the topmost, thickest metal routing interconnect layer M9, a patterned upper drain coil 186 and concentric inner and outer upper gate coils 187A, 187B are formed to be disposed symmetrically about the symmetry axis of the transformer and connected to the underlying patterned lower drain coil 184 and concentric lower gate coils 185A, 185B. As illustrated, a first patterned lower gate coil segment 185A, 187A wraps around one exterior side of the patterned lower drain coil segment 184 and also around the interior sides of the patterned lower drain coil segment 184 with a substantially equidistant spacing between the facing sides. In addition, a second patterned lower gate coil segment 185B, 187B wraps around the opposite exterior side of the patterned lower drain coil segment 184 with a substantially equidistant spacing between the facing sides.

In the example integrated circuit transformer embodiment depicted in FIGS. 18-19, the 2×1 transformer may be formed in the two uppermost metal interconnect layers M8, M9 by using the thicker global metal routing interconnect layer M8 as a cross under winding layer 184, 185B and the thickest metal routing interconnect layer M9 as a cross over winding layer 186C, 187C. However, it will be appreciated, that crossings can be constructed in different ways. For example, 45 degree angled windings tracks may be used to realize the crossings as shown in FIG. 19, but other crossing angles may be used. In addition, it will be appreciated that the winding track length needed for the crossing limits the inner diameter of the transformer. Thus, FIG. 19 shows an example where the inner diameter (across the primary gate winding layer) is only marginally larger than the winding track length 187C, 186C consumed by the crossings. Of course, angled crossing windings tracks can be avoided for a 1×1 turn transformer, in which case the inner diameter can be made even smaller. Having a small inner diameter is important to be able realize the low inductance values needed for the 78 GHz radar circuitry, even when the number of turns is only 1 or 2.

At much lower frequencies, it may be desirable to realize much larger inductance values while maintaining a relatively small transformer diameter. In that case, 2×2, 3×2 or even N×M turn transformers could be desirable of similar construction as shown in FIG. 19, but with having crossing winding tracks at additional locations.

As disclosed herein, there may be several design choices available for building and using a transformer. Firstly, in a stacked transformer, the desired inductive coupling can be obtained by using the same width and diameter for the primary and secondary windings and forming them in different metal (winding) layers. Alternatively, in a lateral transformer, the desired inductive coupling can be obtained by using different diameters for the primary and secondary windings and forming them in the same metal (winding) layers. As a result, the mutual inductance can be increased by increasing the number of primary and secondary windings. Since the winding tracks have to be able to cross each other in order that the different primary and secondary windings can be connected in series, at least two metal (winding) layers are required to ensure that the desired connections between the transformer windings can be made. In other embodiments where the transformer windings are realized in a single metal only, the capacitance between the nested windings can be reduced. When only two metal (winding) layers with sufficient thickness for making high performance transformers are available, the use of stacked layouts is restricted to symmetrical designs having equal numbers of primary and secondary turns, which are capable of providing unity impedance transformation ratios. The lateral architecture is more flexible in this respect and enables transformers with different turn ratios to be fabricated, which can combine balun functionality with impedance transformation functionality using only two metal layers.

An integrated transformer according to this disclosure may be built in a standard IC processing flow, where, after the fabrication of transistors, diodes, and resistors in the substrate, a number of interconnect metal layers are added in the back-end processing. Typically, the ground shield is made by patterning a polysilicon or first metal (ground shield) interconnect layer. The conductive line for connecting to the gate coil center point can be made in a subsequent, relatively thin metal layer, and the conductive line for connecting to the drain coil center point can be made in a subsequent, relatively thick metal layer, such as a first copper layer used for long range circuit connections and local power supply lines. Then, the primary and secondary windings and their crossings may be formed in a third and a fourth metal layer (winding layers), which may include a second copper layer used for long range circuit connections and local power supply lines and a topmost aluminum layer intended for global power supply lines and the bond pads. The different metal layers can be interconnected with vias where necessary.

By now it should be appreciated that there is provided herein an integrated circuit transformer and method for fabricating and operating the same. As disclosed, the integrated circuit transformer includes a primary winding, a secondary winding, and first center tap feed line. The primary winding is located in at least a first winding layer having a first thickness, and has two primary terminals at a first side of the transformer. The secondary winding is located in at least the first winding layer, and has a first center point at the first side of the transformer and two secondary terminals at a second, opposite side of the transformer. In selected embodiments, the primary and secondary windings are concentric. In other embodiments, the primary winding and the secondary winding are both located in the first winding layer and an adjacent last metal layer and each have a different winding radius. The first center tap feed line is located along a symmetry axis of the transformer in an upper metal layer having a second thickness that is at least equivalent to the first thickness of the first winding layer, and has a direct electrical connection to the first center point in the secondary winding. In selected embodiments, the first center tap feed line is formed in a first upper metal copper layer that is located below a second, adjacent upper metal copper layer comprising the first winding layer, where the first and second, adjacent upper metal copper layers have substantially the same thickness. In other embodiments, the first center tap feed line is formed in a first upper conductive metal layer that is located above a second upper conductive metal layer comprising the first winding layer, where the first upper conductive metal layer is at least as thick as the second upper conductive metal layer. In other embodiments, the first center tap feed line is formed in a plurality of lower conductive metal layers in direct electrical connection with each other that are located below an upper conductive metal layer comprising the first winding layer, where the plurality of lower conductive metal layers have a combined thickness that is at least as thick as the upper conductive metal layer. The integrated circuit transformer may also include a substrate and a patterned ground shield layer located between the first winding layer and the substrate. In addition, the integrated circuit transformer may have a second center tap feed line located along the symmetry axis of the transformer in a lower metal layer between the patterned ground shield layer and the first winding layer, wherein the second center tap feed line has a direct electrical connection to a second center point in the secondary winding and has a thickness that is less than the second thickness of the upper metal layer. In selected embodiments, the integrated circuit transformer's primary and secondary windings form a 1×1 transformer in two upper, relatively thick metal interconnect layers. In other embodiments, the integrated circuit transformer's primary and secondary windings form a 2×1 transformer in two upper, relatively thick metal interconnect layers. In selected embodiments, the two primary terminals of the primary winding are connected to gate terminals G+, G− of an output amplifier, and the two secondary terminals of the secondary winding are connected to drain terminals D+, D− of an input amplifier. In addition, the integrated circuit transformer may include a patterned supply voltage routing track formed in the upper metal layer to be symmetrically disposed about the symmetry axis, wherein the patterned supply voltage routing track is laterally spaced apart from the primary and secondary windings by a minimum spacing distance which is selected to prevent induced RF current in the patterned supply voltage routing track from adversely impacting transformer performance.

In another form, there is provided herein an electronic circuit and method for fabricating and operating the same. As disclosed, the electronic circuit includes a first power amplifier having first and second output drain terminals, and a second power amplifier having first and second input gate terminals. The electronic circuit also includes an integrated circuit transformer connected between the first and second power amplifiers. As formed, the integrated circuit transformer includes a primary gate winding, a secondary drain winding, and a center tap feed line. The primary gate winding is located in at least a first relatively thick upper metal interconnect layer, and has a gate center point at a first side of the integrated circuit transformer and two primary terminals at a second, opposite side of the integrated circuit transformer which are connected to the first and second input gate terminals of the second power amplifier. The secondary drain winding is located in at least the first relatively thick upper metal interconnect layer and has a drain center point at the second, opposite side of the integrated circuit transformer and two secondary terminals at the first side of the integrated circuit transformer which are connected to the first and second output drain terminals of the first power amplifier. The first center tap feed line is located along a symmetry axis of the integrated circuit transformer in a second, relatively thick upper metal interconnect layer that is at least as thick as the first relatively thick upper metal interconnect layer, wherein the first center tap feed line is directly electrically connected to the drain center point of the secondary drain winding. In selected embodiments, the first center tap feed line is formed in a first upper metal copper layer that is located below a second, adjacent upper metal copper layer which forms the primary gate winding and secondary drain winding, where the first and second, adjacent upper metal copper layers have substantially the same thickness. In other embodiments, the first center tap feed line is formed in a first upper conductive metal layer that is located above a second upper conductive metal layer which forms the primary gate winding and secondary drain winding, where the first upper conductive metal layer is at least as thick as the second upper conductive metal layer. In still other embodiments, the first center tap feed line is formed in a plurality of lower conductive metal layers in direct electrical connection with each other that are located below an upper conductive metal layer which forms the primary gate winding and secondary drain winding, where the plurality of lower conductive metal layers have a combined thickness that is at least as thick as the upper conductive metal layer. The electronic circuit may also include a patterned supply voltage routing track formed in the second, relatively thick upper metal interconnect layer to be symmetrically disposed about the symmetry axis, wherein the patterned supply voltage routing track is laterally spaced apart from the primary gate winding by a minimum spacing distance which is selected to prevent the primary gate winding from inducing RF current in the patterned supply voltage routing track which adversely impacts transformer performance. In selected embodiments, the primary gate winding and secondary drain winding are concentrically shaped windings having different winding radii to form a 1×1 transformer in two upper, relatively thick metal interconnect layers. In other embodiments, the primary gate winding and secondary drain winding are concentrically shaped windings having different winding radii to form a 2×1 transformer in two upper, relatively thick metal interconnect layers.

In yet another form, there is provided a transformer and method for fabricating and operating the same. As disclosed, the transformer circuit includes at least one primary turn formed in an upper metal interconnect layer having a first local power supply line thickness and symmetrically disposed along a symmetry axis of the transformer. The transformer also includes at least one secondary turn formed in the upper metal interconnect layer and symmetrically disposed along the symmetry axis of the transformer. In addition the transformer includes a first center tap feed line located along the symmetry axis of the transformer in an upper metal interconnect layer that is at least as thick as the first local power supply line thickness, wherein the first center tap feed line is directly electrically connected to a drain center point of the at least one secondary turn. In selected embodiments, the at least one primary turn is formed as a gate winding with a single outer circular segment formed in a lower layer and two semi-circular segments formed in an upper layer in alignment with the single outer circular segment and electrically connected across conductive via structures by the single semi-circular segment formed in the lower layer. In addition, the at least one secondary turn is formed as a drain winding with a single concentric inner circular segment formed in a lower layer and electrically connected to a single circular segment formed in an upper layer in alignment with the single concentric inner circular segment layer. In other embodiments, the at least one primary turn is formed as a gate winding using multiple segments which are concentrically located on both an inside and outside of the at least one secondary turn which is a drain winding. In such embodiments, the at least one secondary turn is formed as a drain winding with a first circular segment formed in a lower layer that is electrically connected to an aligned second circular segment formed in an upper layer. In addition, the gate winding includes a first semi-circular winding segment formed in a lower layer that is electrically connected to an aligned first semi-circular winding segment formed in an upper layer, where the first semi-circular winding segment is located a uniform distance from a first outer half of the first circular segment. In addition, the gate winding includes a second winding segment formed in a lower layer that is electrically connected to an aligned first segment formed in an upper layer, where the first segment is located a uniform distance from a second outer half of the first circular segment and is also located a uniform distance from the insider of the first circular segment.

Although the described exemplary embodiments disclosed herein are directed to an integrated circuit-based transformer device and associated method of manufacture in which a transformer coil center point is contacted from two opposite sides along the symmetry axis of the transformer using a metal layer having a width and/or thickness that is similar to the metal layer used to form the transformer coil, the present invention is not necessarily limited to the example embodiments which illustrate inventive aspects of the present invention that are applicable to a wide variety of integrated circuit transformer devices. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

Although the described exemplary embodiments disclosed herein focus on an single turn inductor structure formed in two metal layers, the present invention is not necessarily limited to the example embodiments illustrate herein and may be applied to protect any integrated circuit inductors formed in one or more metal layers. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit transformer, comprising:
    a primary winding located in at least a first winding layer having a first thickness, the primary winding having two primary terminals at a first side of the transformer;
    a secondary winding located in at least the first winding layer, the secondary winding having a first center point at the first side of the transformer and two secondary terminals at a second, laterally opposite side of the transformer;
    a first center tap feed line located along a symmetry axis of the transformer in an upper metal layer having a second thickness that is at least equivalent to the first thickness of the first winding layer, wherein the first center tap feed line has a direct electrical connection to the first center point in the secondary winding;
    a second center tap feed line located along the symmetry axis of the transformer in a lower metal layer wherein the second center tap feed line has a direct electrical connection to a second center point in the primary winding, wherein the upper metal layer and lower metal layer are different metal layers.

2. The integrated circuit transformer of claim 1, further comprising a substrate and a patterned ground shield located between the first winding layer and the substrate to electrically shield the primary and secondary windings from the substrate.

3. The integrated circuit transformer of claim 2, wherein the lower metal layer is located between the patterned ground shield and the first winding layer, wherein the lower metal layer has a thickness that is less than the second thickness of the upper metal layer.

4. The integrated circuit transformer of claim 1, wherein the first center tap feed line is located in a first upper metal copper layer that is located below a second, adjacent upper metal copper layer comprising the first winding layer, where the first and second, adjacent upper metal copper layers have substantially the same thickness.

5. The integrated circuit transformer of claim 1, wherein the first center tap feed line is located in a first upper conductive metal layer that is located above a second upper conductive metal layer comprising the first winding layer, where the first upper conductive metal layer is at least as thick as the second upper conductive metal layer.

6. The integrated circuit transformer of claim 1, wherein the first center tap feed line comprises a plurality of lower conductive metal layers in direct electrical connection with each other that are located below an upper conductive metal layer comprising the first winding layer, where the plurality of lower conductive metal layers have a combined thickness that is at least as thick as the upper conductive metal layer.

7. The integrated circuit transformer of claim 1, wherein the primary and secondary windings are concentric.

8. The integrated circuit transformer of claim 1, wherein the primary winding and the secondary winding are both located in the first winding layer and an adjacent last metal layer and each have a different winding radius.

9. The integrated circuit transformer of claim 1, wherein the primary and secondary windings form a 1×1 transformer in two upper, relatively thick metal interconnect layers.

10. The integrated circuit transformer of claim 1, wherein the primary and secondary windings form a N×M transformer in two upper, relatively thick metal interconnect layers, wherein at least one of the group of N and M is greater than 1.

11. The integrated circuit transformer of claim 1, wherein the two primary terminals of the primary winding are connected to gate terminals G+, G− of an output amplifier, and where the two secondary terminals of the secondary winding are connected to drain terminals D+, D− of an input amplifier.

12. The integrated circuit transformer of claim 1, further comprising a patterned supply voltage routing track formed in the upper metal layer to be symmetrically disposed about the symmetry axis, wherein the patterned supply voltage routing track is laterally spaced apart from the primary and secondary windings by a minimum spacing distance which is selected to prevent induced RF current in the patterned supply voltage routing track from adversely impacting transformer performance.

13. An integrated circuit transformer, comprising:
a first winding located in at least a first winding layer having a first thickness, the first winding having two first terminals at a first side of the transformer;
a second winding located in at least the first winding layer, the second winding having a first center point at the first side of the transformer and two second terminals at a second, laterally opposite side of the transformer;
a first center tap feed line located along a symmetry axis of the transformer in an upper metal layer having a second thickness that is at least equivalent to the first thickness of the first winding layer, wherein the first center tap feed line has a direct electrical connection to the first center point in the second winding;
a second center tap feed line located along the symmetry axis of the transformer in a lower metal layer wherein the second center tap feed line has a direct electrical connection to a second center point in the first winding, wherein the upper metal layer and lower metal layer are different metal layers.

14. The integrated circuit transformer of claim 13, further comprising a substrate and a patterned ground shield located between the first winding layer and the substrate to electrically shield the first and second windings from the substrate.

15. The integrated circuit transformer of claim 14, wherein the lower metal layer is located between the patterned ground shield and the first winding layer, wherein the lower metal layer has a thickness that is less than the second thickness of the upper metal layer.

16. The integrated circuit transformer of claim 13, wherein the first center tap feed line is located in a first upper metal copper layer that is located below a second, adjacent upper metal copper layer comprising the first winding layer, where the first and second, adjacent upper metal copper layers have substantially the same thickness.

17. The integrated circuit transformer of claim 13, wherein the first center tap feed line is located in a first upper conductive metal layer that is located above a second upper conductive metal layer comprising the first winding layer, where the first upper conductive metal layer is at least as thick as the second upper conductive metal layer.

18. The integrated circuit transformer of claim 13, wherein the first center tap feed line comprises a plurality of lower conductive metal layers in direct electrical connection with each other that are located below an upper conductive metal layer comprising the first winding layer, where the plurality of lower conductive metal layers have a combined thickness that is at least as thick as the upper conductive metal layer.

19. The integrated circuit transformer of claim 13, wherein the first and second windings are concentric.

20. The integrated circuit transformer of claim 13, wherein the first winding and the second winding are both located in the first winding layer and an adjacent last metal layer and each have a different winding radius.

* * * * *